(12) United States Patent (10) Patent No.: US 12,672,238 B2
Wilcoxon et al. (45) Date of Patent: Jun. 30, 2026

(54) PACKAGING ARCHITECTURE FOR A HIGH FREQUENCY ACTIVE ELECTRONICALLY SCANNED ARRAY

(71) Applicant: Rockwell Collins, Inc., Cedar Rapids, IA (US)

(72) Inventors: Ross K. Wilcoxon, Cedar Rapids, IA (US); Jeremiah D. Wolf, Atkins, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 311 days.

(21) Appl. No.: 18/404,130

(22) Filed: Jan. 4, 2024

(65) Prior Publication Data

US 2025/0227848 A1     Jul. 10, 2025

(51) Int. Cl.
| | |
|---|---|
| *H05K 1/18* | (2026.01) |
| *H01Q 1/02* | (2006.01) |
| *H01Q 1/22* | (2006.01) |
| *H01Q 3/36* | (2006.01) |
| *H05K 7/20* | (2006.01) |

(52) U.S. Cl.
CPC ................. *H05K 1/18* (2013.01); *H01Q 1/02* (2013.01); *H01Q 1/22* (2013.01); *H01Q 3/36* (2013.01); *H05K 7/20509* (2013.01); *H05K 2201/09027* (2013.01); *H05K 2201/10098* (2013.01); *H05K 2201/10189* (2013.01); *H05K 2201/10522* (2013.01)

(58) Field of Classification Search
CPC ........ H05K 1/18; H05K 7/20509; H01Q 1/02; H01Q 1/22; H01Q 3/36

USPC .......................................................... 342/368
See application file for complete search history.

(56) References Cited

U.S. PATENT DOCUMENTS

| | | | |
|---|---|---|---|
| 6,067,053 A * | 5/2000 | Runyon ............... | H01Q 21/205 343/820 |
| 6,421,021 B1 * | 7/2002 | Rupp .................. | H01Q 21/0025 343/753 |
| 6,469,671 B1 | 10/2002 | Pluymers et al. | |
| 7,265,719 B1 | 9/2007 | Moosbrugger et al. | |
| 7,511,664 B1 | 3/2009 | Mason et al. | |
| 7,889,147 B2 | 2/2011 | Tam et al. | |
| 8,937,574 B2 | 1/2015 | Edward et al. | |
| 9,865,937 B1 | 1/2018 | Wolf et al. | |
| 10,230,172 B1 | 3/2019 | Wolf et al. | |
| 10,665,957 B1 | 5/2020 | Seller et al. | |
| 10,784,588 B2 | 9/2020 | Svensson et al. | |
| 11,139,585 B2 | 10/2021 | Saito et al. | |

(Continued)

OTHER PUBLICATIONS

European Search Report received in EP Application No. 24223855. 8, May 21, 2025, 13 pages.

(Continued)

*Primary Examiner* — Brady W Frazier
(74) *Attorney, Agent, or Firm* — Suiter Swantz IP

(57) ABSTRACT

A packaging architecture for a high frequency active electronically scanned array is described. The packaging architecture enables the thermal management benefits of a card-fed approach to be extended to higher-frequency AESA to operate with higher output power and/or duty cycle. The packaging architecture includes circuit cards that are non-rectangular in shape to provide room for thermal management solutions that are placed between adjacent circuit cards.

16 Claims, 16 Drawing Sheets

(56)  References Cited

U.S. PATENT DOCUMENTS

| | | | |
|---|---|---|---|
| 11,695,206 | B2 | 7/2023 | Massman |
| 2003/0214450 | A1* | 11/2003 | Lynch ................ H01Q 21/0087 |
| | | | 343/772 |
| 2011/0057852 | A1* | 3/2011 | Holland ............... H01Q 13/085 |
| | | | 343/810 |
| 2020/0052364 | A1 | 2/2020 | Kuwabara et al. |
| 2021/0194148 | A1 | 6/2021 | West et al. |
| 2022/0294123 | A1 | 9/2022 | Sikina et al. |
| 2023/0113572 | A1 | 4/2023 | Rhoden et al. |
| 2023/0178900 | A1 | 6/2023 | Shamblin et al. |
| 2023/0307847 | A1 | 9/2023 | West et al. |
| 2023/0314091 | A1 | 10/2023 | Ranjan et al. |

OTHER PUBLICATIONS

Pfeiffer Carl et al: "High Power AESAs for 20-60 GHz with Linear and Circular Polarizations", 2019 IEEE International Symposium on Phased Array System & Technology (PAST), IEEE, Oct. 15, 2019 (Oct. 15, 2019), pp. 1-4, XP033732202, DOI: 10.1109/PAST43306.2019.9020865.

* cited by examiner

100

100

106

100

100

PACKAGING ARCHITECTURE FOR A HIGH FREQUENCY ACTIVE ELECTRONICALLY SCANNED ARRAY

TECHNICAL FIELD

The present invention generally relates to antennas, and more specifically to feeds for antenna arrays.

BACKGROUND

Active Electronically Scanned Arrays (AESAs) are limited by their thermal management capabilities to remove the power dissipated by electronic components, such as power amplifiers.

Non-scalable AESAs can have electronics and thermal management on the perimeter around the array, which reduces the packaging challenges but also prevents AESAs from being 'tiled' to allow the effective size of the array to be modified by adding multiple sub-tiles together.

In a planar, scalable AESA, radiating elements are incorporated into a single plane with the electronic components that drive the elements located in the space of a single unit cell of the array. Power dissipated from those components must be removed from the area of the unit cell of each element, so the average heat flux at that location is heat dissipation divided by the element area, which decreases by a factor of the operating frequency squared.

Another packaging approach for AESAs is to use a card-fed array in which the circuit cards that contain electronic components are oriented perpendicular to the radiating plane of the AESA. The card-fed approach adds to the depth of the array (the distance perpendicular to the radiating plane) and increases the space available for feed lines, driving circuitry, thermal management, and the like. Thermal spreaders placed between the circuit cards can transport the dissipated power to one or more edges of the array. Card-fed AESAs, in which driving circuitry is on parallel circuit cards that feed an aperture, can generally dissipate more power than planar arrays.

Physical geometry constraints of card-fed AESA architectures severely limit the possible output power at higher frequencies. As the operating frequency of an AESA increases, the space between circuit cards and radiating elements must decrease to maintain the correct element spacing at half-wavelengths. At higher operating frequencies, the spacing between circuit cards of the card-fed AESAs is too small for effective thermal management. At a sufficiently high frequency, the circuit card and component thicknesses will be as large as the required element spacing, thereby leaving no room for thermal spreaders.

As AESA frequencies increase and the spacing between radiating elements decreases, the heat flux associated with the dissipated power substantially increases while the space available for integrating thermal management components for removing that dissipated power decreases, even for card-fed AESAs. The heat flux may force the card-fed AESAs to be operated at lower output power, which reduces the card-fed AESA's capabilities compared to planar AESAs. Therefore, it would be advantageous to provide a device, system, and method that cures the shortcomings described above.

SUMMARY

In some aspects, the techniques described herein relate to a circuit card including: a substrate; wherein the substrate includes one or more wide portions and one or more narrow portions; wherein the one or more wide portions are wider than the one or more narrow portions; wherein the one or more narrow portions extends from the one or more wide portions; a plurality of radiating elements; wherein the plurality of radiating elements are disposed on the one or more wide portions of the substrate; wherein the plurality of radiating elements are arranged in a line; a plurality of transmission lines; a plurality of transmit/receive modules; wherein the plurality of transmit/receive modules are disposed on the one or more narrow portions of the substrate; wherein the plurality of transmission lines connect the plurality of radiating elements with the plurality of transmit/receive modules; and a plurality of backplane interfaces; wherein the plurality of backplane interfaces are coupled to the plurality of transmit/receive modules.

In some aspects, the techniques described herein relate to a circuit card, wherein the plurality of radiating elements include a one-half wavelength spacing between adjacent of the plurality of radiating elements.

In some aspects, the techniques described herein relate to a circuit card, wherein an operational frequency of the circuit card is in at least one of a Ka-band, a V-band, or a W-band.

In some aspects, the techniques described herein relate to a circuit card, wherein the operational frequency of the circuit card is between 40 to 100 GHz.

In some aspects, the techniques described herein relate to a circuit card, wherein the plurality of transmit/receive modules are larger than the one-half wavelength spacing; wherein the plurality of transmit/receive modules are staggered on the substrate.

In some aspects, the techniques described herein relate to a circuit card, wherein the plurality of transmit/receive modules are staggered on the substrate along a pair of diagonal lines. 7.

In some aspects, the techniques described herein relate to a circuit card, wherein each of the plurality of transmit/receive modules are connected to a respective of the plurality of radiating elements.

In some aspects, the techniques described herein relate to a circuit card, wherein the one or more wide portions are at least twice as wide as the one or more narrow portions.

In some aspects, the techniques described herein relate to a circuit card, wherein the substrate is one of an L-shape or a U-shape.

In some aspects, the techniques described herein relate to a circuit card, wherein the plurality of radiating elements are disposed on an edge of the one or more wide portions of the substrate.

In some aspects, the techniques described herein relate to a circuit card, wherein the one or more wide portions and the one or more narrow portions are co-planar.

In some aspects, the techniques described herein relate to a card-fed array including: a first plurality of circuit cards; a second plurality of circuit cards; wherein the first plurality of circuit cards alternate with the second plurality of circuit cards; wherein each of the first plurality of circuit cards and the second plurality of circuit cards include: a substrate; wherein the substrate includes one or more wide portions and one or more narrow portions; wherein the one or more wide portions are wider than the one or more narrow portions; wherein the one or more narrow portions extend from the one or more wide portions; a plurality of radiating elements; wherein the plurality of radiating elements are disposed on the one or more wide portions of the substrate; wherein the plurality of radiating elements are arranged in a line; a plurality of transmission lines; a plurality of transmit/ receive modules; wherein the plurality of transmit/receive modules are disposed on the one or more narrow portions of the substrate; wherein the plurality of transmission lines connect the plurality of radiating elements with the plurality of transmit/receive modules; and a plurality of backplane interfaces; wherein the plurality of backplane interfaces are coupled to the plurality of transmit/receive modules; a first plurality of thermal spreaders; wherein the first plurality of thermal spreaders are coupled to the one or more narrow portions of the substrates of the first plurality of circuit cards; and a second plurality of thermal spreaders; wherein the second plurality of thermal spreaders are coupled to the one or more narrow portions of the substrates of the second plurality of circuit cards; wherein the card-fed array is an active electronically scanned array.

In some aspects, the techniques described herein relate to a card-fed array, wherein the first plurality of circuit cards and the second plurality of circuit cards are arranged in parallel.

In some aspects, the techniques described herein relate to a card-fed array, wherein the second plurality of circuit cards are mirrored to the first plurality of circuit cards.

In some aspects, the techniques described herein relate to a card-fed array, wherein the one or more narrow portions of the substrates of the second plurality of circuit cards are inverted to the one or more narrow portions of the substrates of the first plurality of circuit cards.

In some aspects, the techniques described herein relate to a card-fed array, wherein each of the first plurality of thermal spreaders and the second plurality of thermal spreaders include a plate and a flange; wherein the flange extends from the plate; wherein the plates of the first plurality of thermal spreaders are coupled to the one or more narrow portions of the substrates of the first plurality of circuit cards; wherein the plates of the second plurality of thermal spreaders are coupled to the one or more narrow portions of the substrates of the second plurality of circuit cards.

In some aspects, the techniques described herein relate to a card-fed array, wherein the flanges of the first plurality of thermal spreaders abut with adjacent flanges of the first plurality of thermal spreaders; wherein the flanges of the second plurality of thermal spreaders abut with adjacent flanges of the second plurality of thermal spreaders.

In some aspects, the techniques described herein relate to a card-fed array, wherein the first plurality of thermal spreaders and the second plurality of thermal spreader each include a spreader-to-spreader interface; wherein the spreader-to-spreader interfaces connect the plates of the first plurality of thermal spreaders and the plates of the second plurality of thermal spreaders.

In some aspects, the techniques described herein relate to a card-fed array, wherein the plates of the first plurality of thermal spreaders are offset from the plates of the second plurality of thermal spreaders.

In some aspects, the techniques described herein relate to a card-fed array including: a first plurality of circuit cards; a second plurality of circuit cards; wherein the first plurality of circuit cards alternate with the second plurality of circuit cards; wherein each of the first plurality of circuit cards and the second plurality of circuit cards include: a substrate; wherein the substrate includes one or more wide portions and one or more narrow portions; wherein the one or more wide portions are wider than the one or more narrow portions; wherein the one or more narrow portions extend from the one or more wide portions; a plurality of connectors; wherein the plurality of connectors are disposed on the wide portion of the substrate; wherein the plurality of connectors are arranged in a line; a plurality of transmission lines; a plurality of transmit/receive modules; wherein the plurality of transmit/receive modules are disposed on the one or more narrow portions of the substrate; wherein the plurality of transmission lines connect the plurality of connectors with the plurality of transmit/receive modules; and a plurality of backplane interfaces; wherein the plurality of backplane interfaces are coupled to the plurality of transmit/ receive modules; a first plurality of thermal spreaders; wherein the first plurality of thermal spreaders are coupled to the one or more narrow portions of the substrates of the first plurality of circuit cards; a second plurality of thermal spreaders; wherein the second plurality of thermal spreaders are coupled to the one or more narrow portions of the substrates of the second plurality of circuit cards; and one or more third circuit cards; wherein the one or more third circuit cards are orthogonal to the first plurality of circuit cards and the second plurality of circuit cards; wherein the one or more third circuit cards include a plurality of radiating elements; wherein the plurality of radiating elements are connected to the plurality of connectors; wherein the card-fed array is an active electronically scanned array.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE INVENTION

Figure 1:
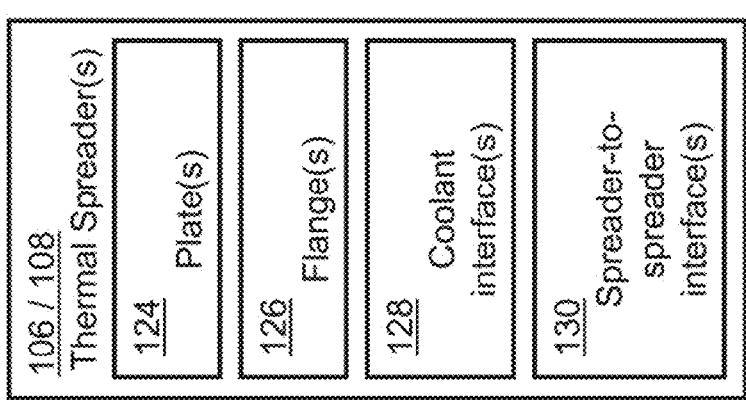
FIG. 1 depicts a simplified block diagram of a card-fed array, in accordance with one or more embodiments of the present disclosure.
Figure 1:
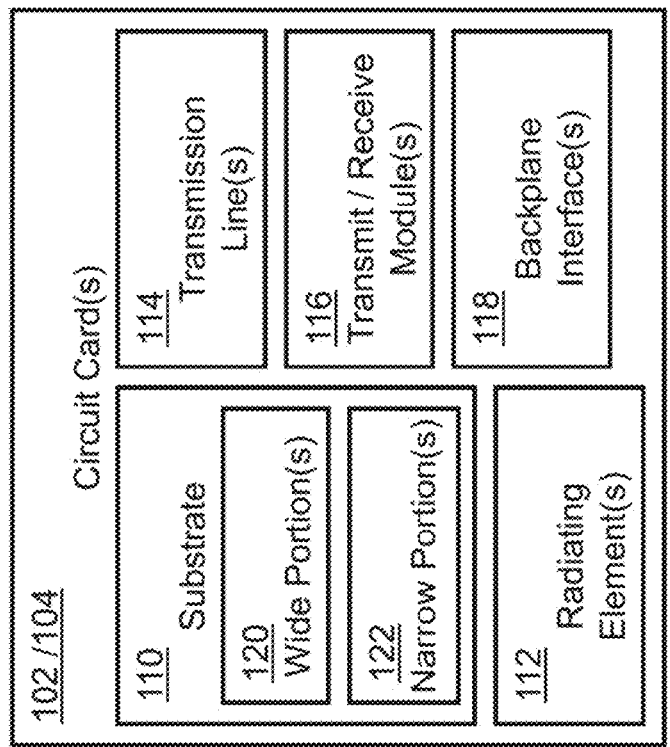
Figure 2A:
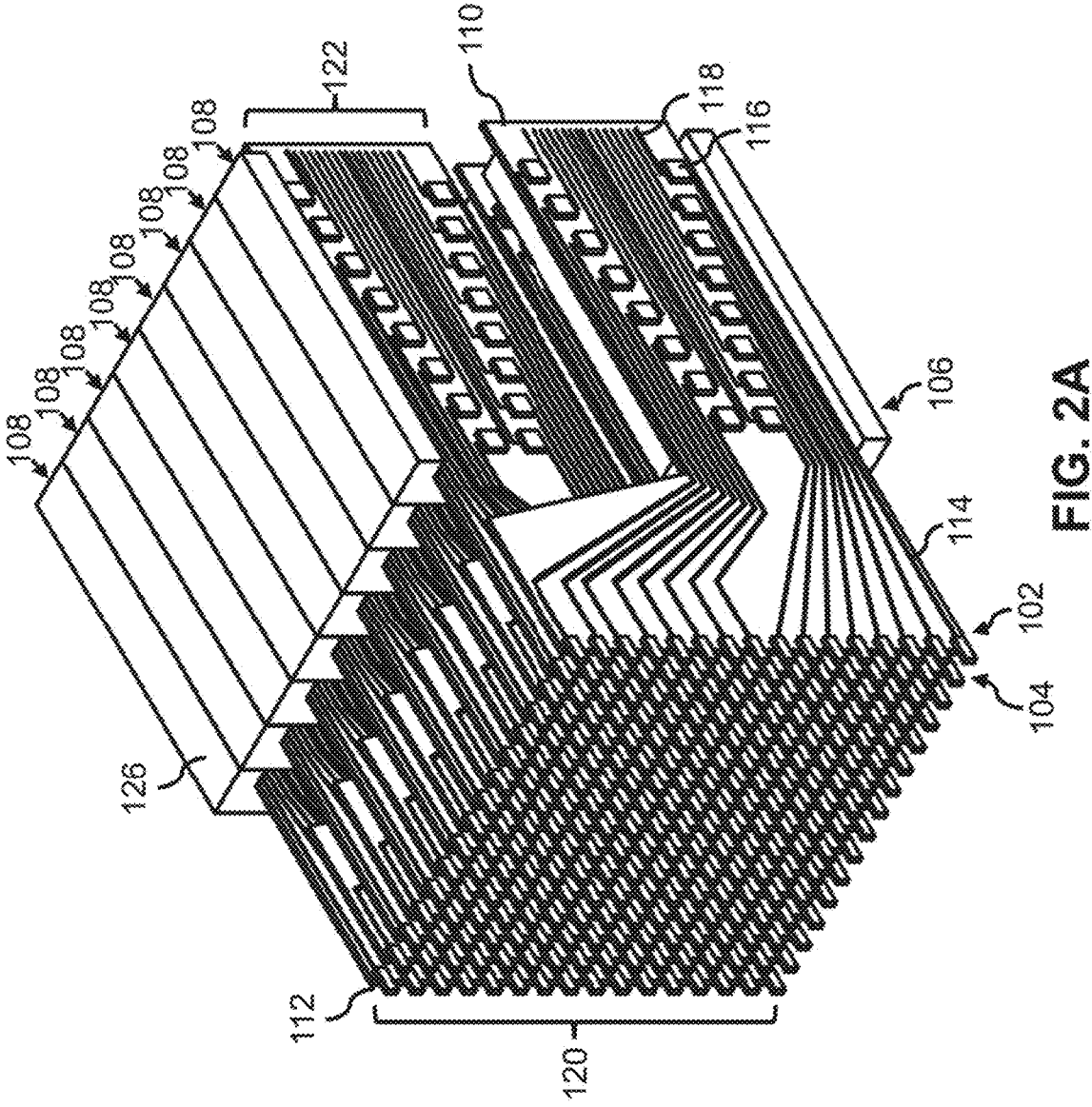
FIG. 2A depicts a front right perspective view of an exemplary card-fed array, in accordance with one or more embodiments of the present disclosure.
Figure 2B:
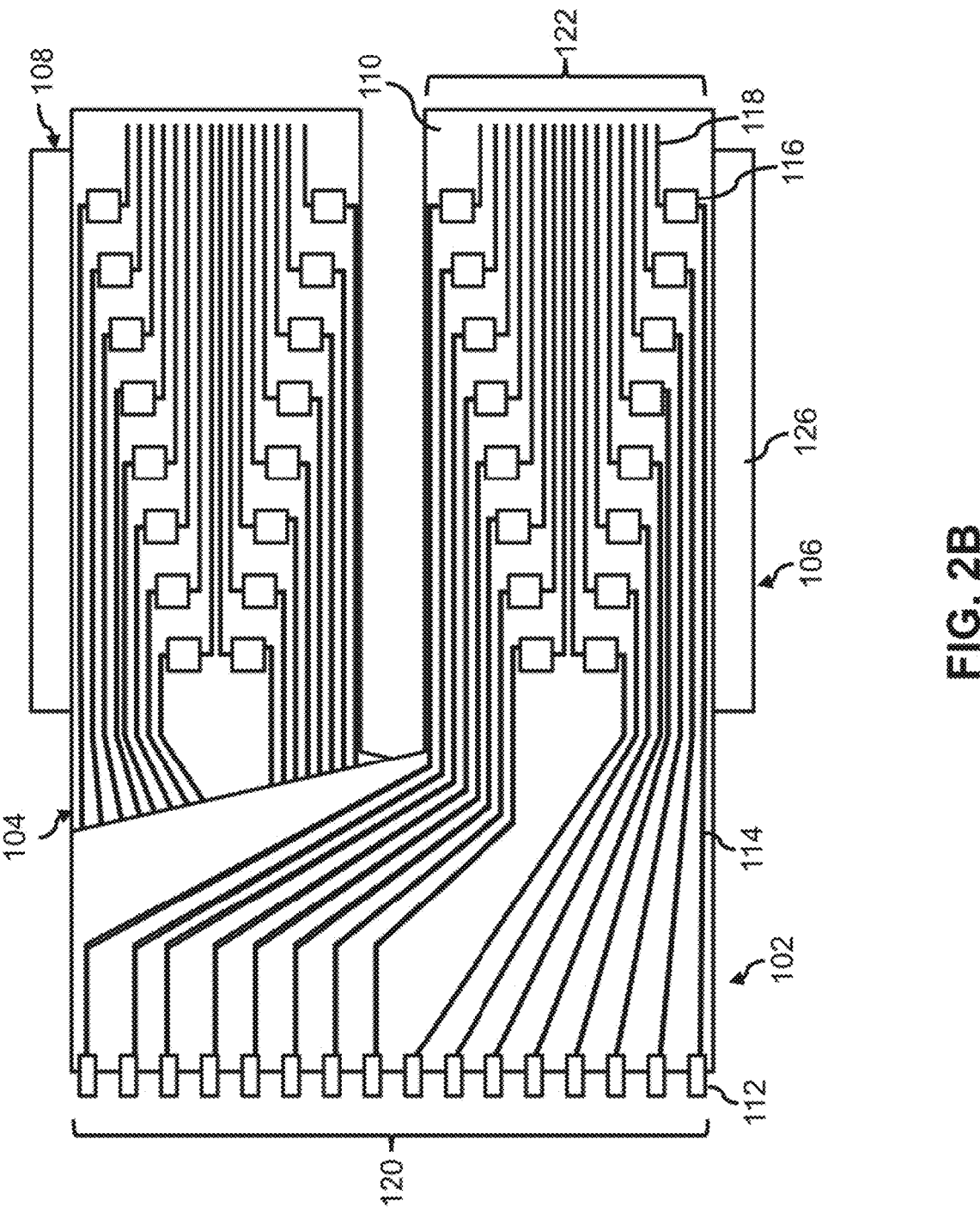
FIG. 2B depicts a right view of the exemplary card-fed array, in accordance with one or more embodiments of the present disclosure.
Figure 2C:
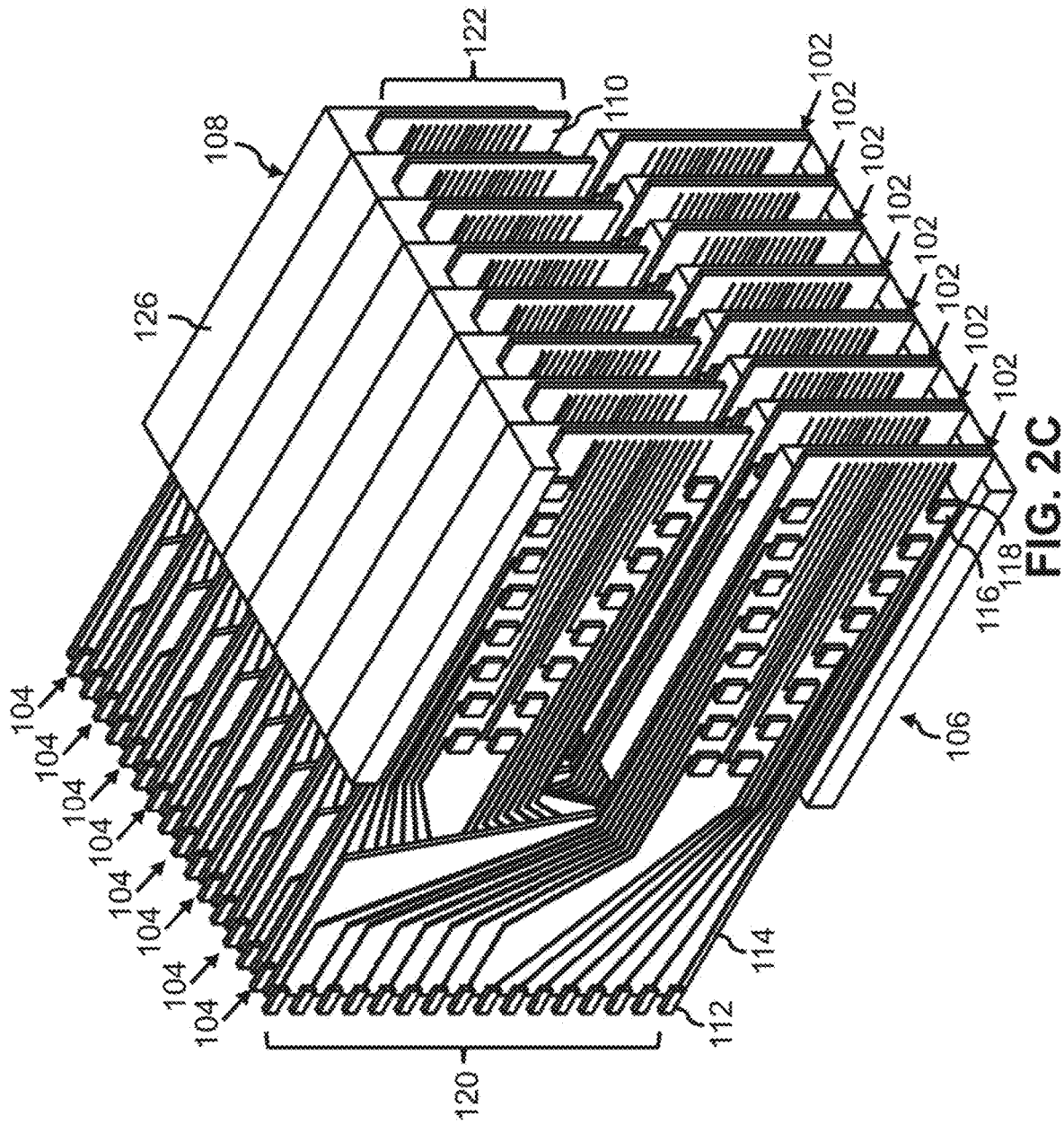
FIG. 2C depicts a right rear perspective view of the exemplary card-fed array, in accordance with one or more embodiments of the present disclosure.
Figure 2D:
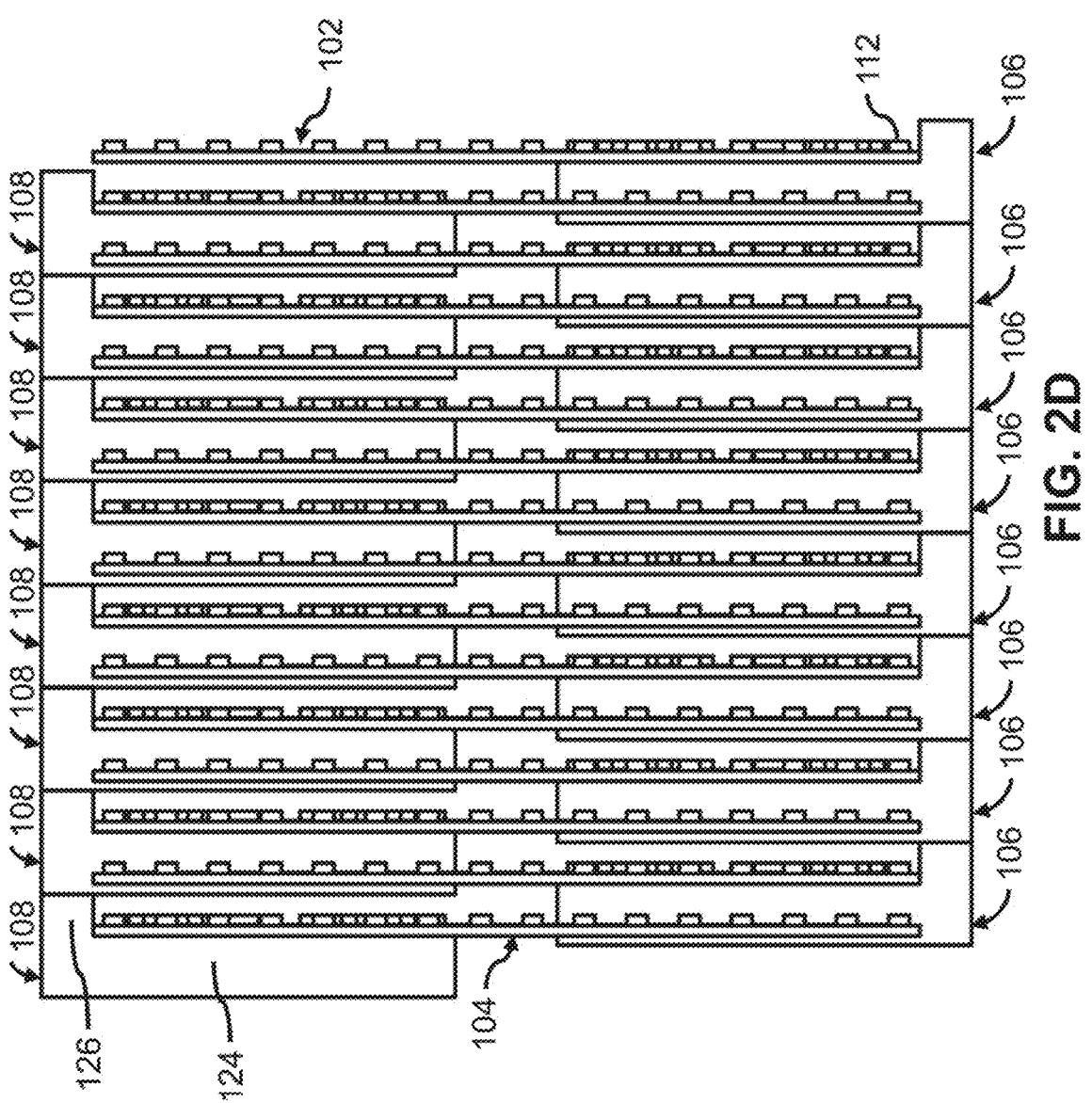
FIG. 2D depicts a front view of the exemplary card-fed array, in accordance with one or more embodiments of the present disclosure.
Figure 2E:
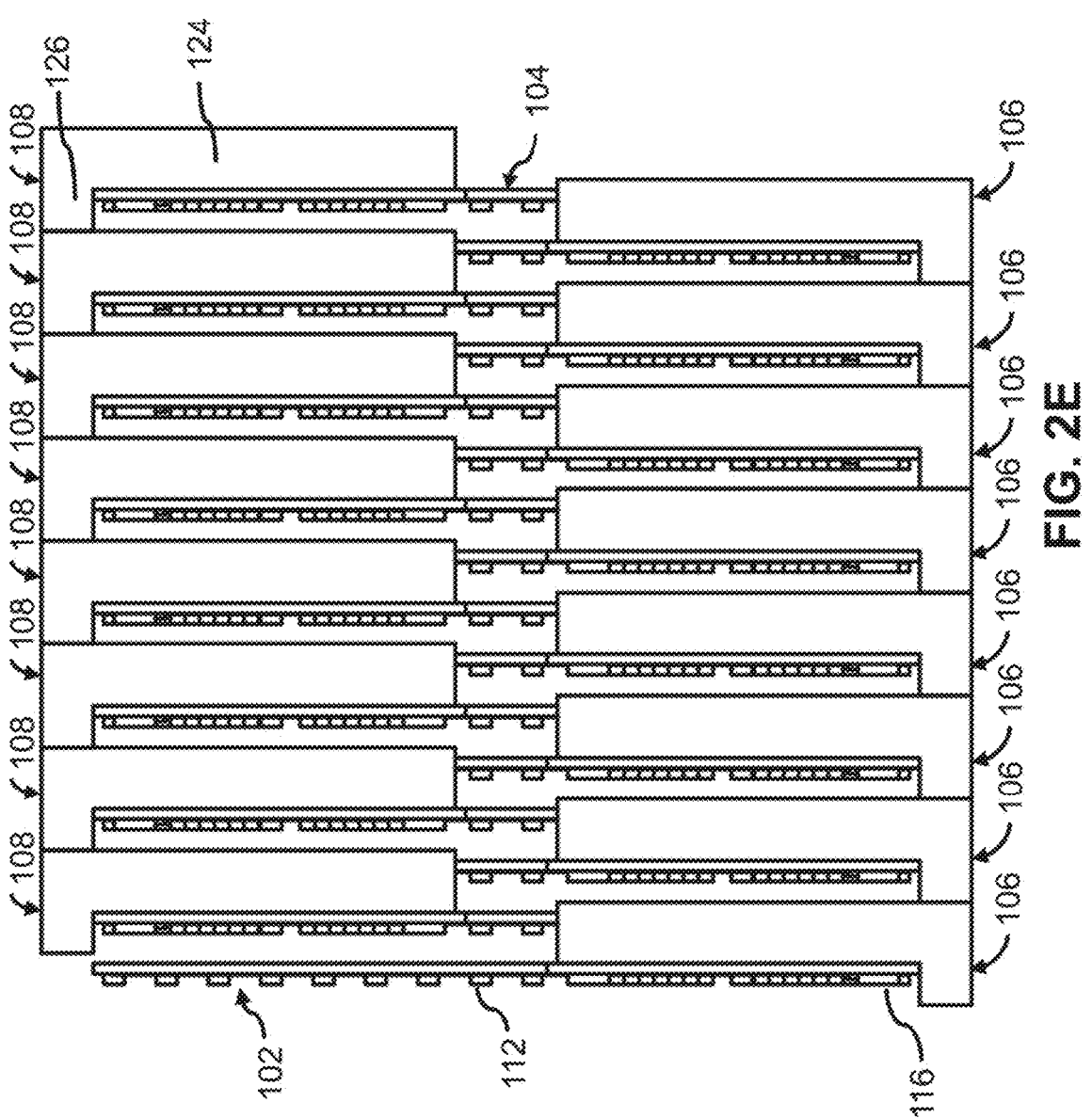
FIG. 2E depicts a rear perspective view of the exemplary card-fed array, in accordance with one or more embodiments of the present disclosure.
Figure 2F:
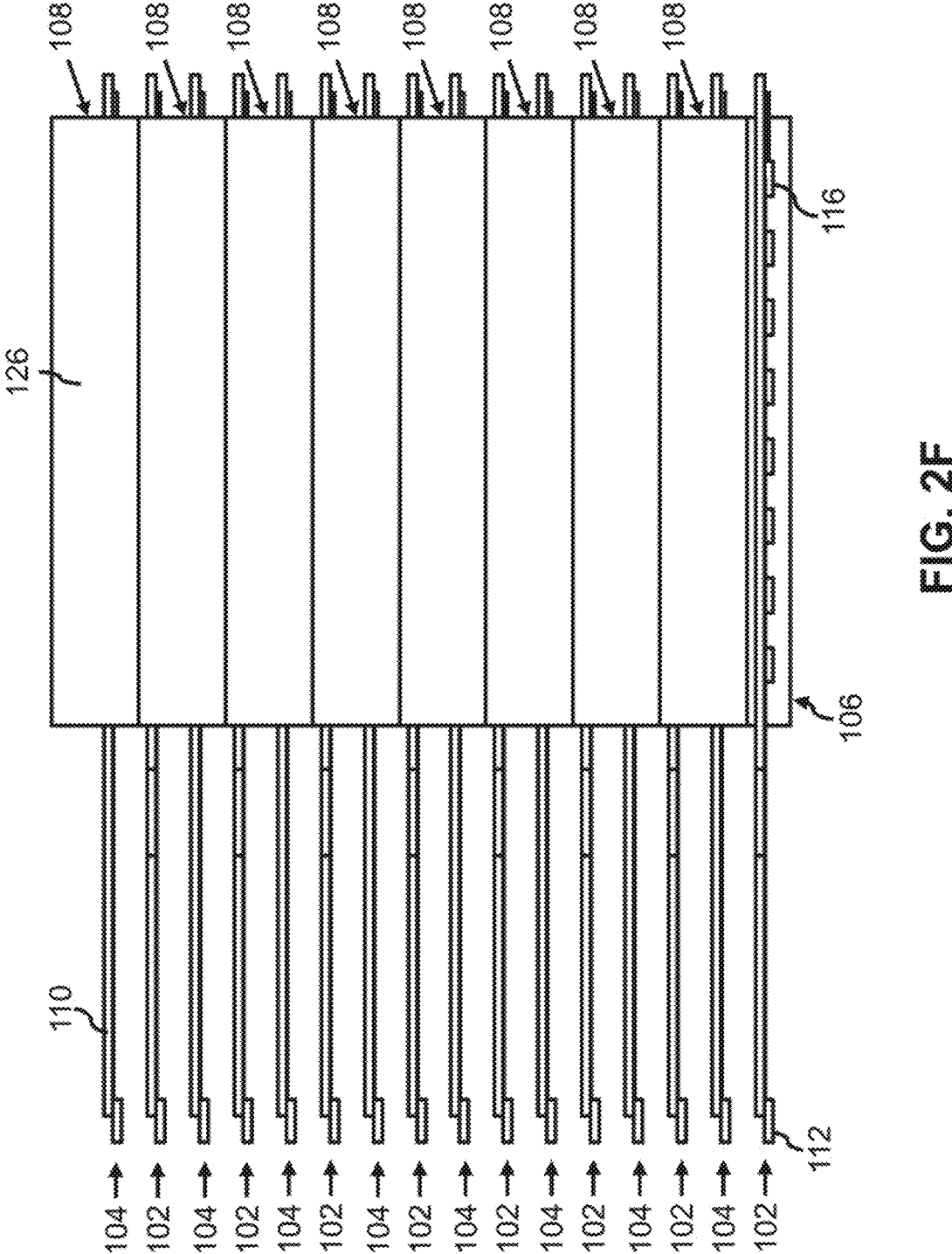
FIG. 2F depicts a top view of the exemplary card-fed array, in accordance with one or more embodiments of the present disclosure.
Figure 2G:
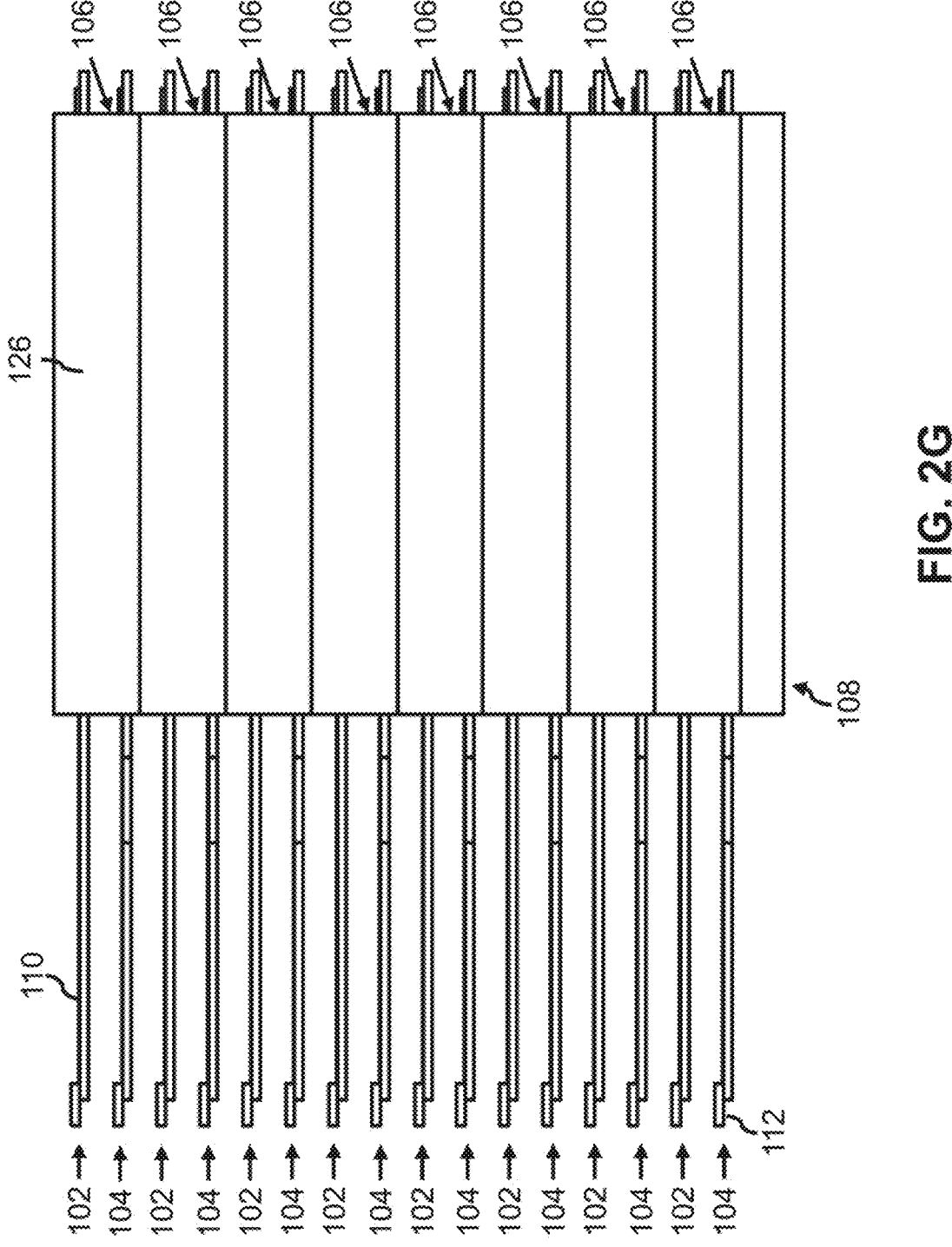
FIG. 2G depicts a bottom view of the exemplary card-fed array, in accordance with one or more embodiments of the present disclosure.
Figure 2H:
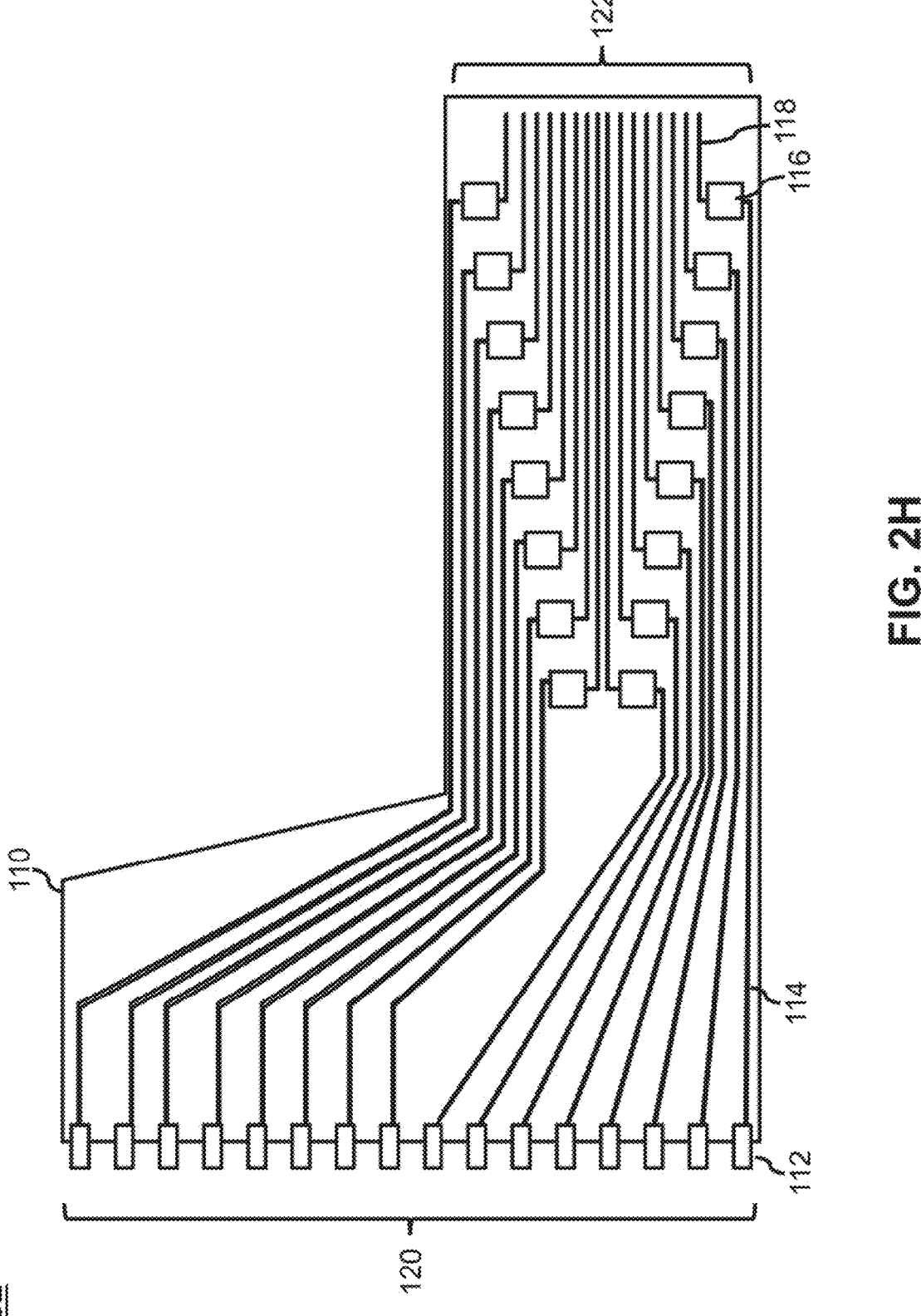
FIG. 2H depicts a right view of a first circuit card of the exemplary card-fed array with a substrate with an L-shape, in accordance with one or more embodiments of the present disclosure.
Figure 2I:
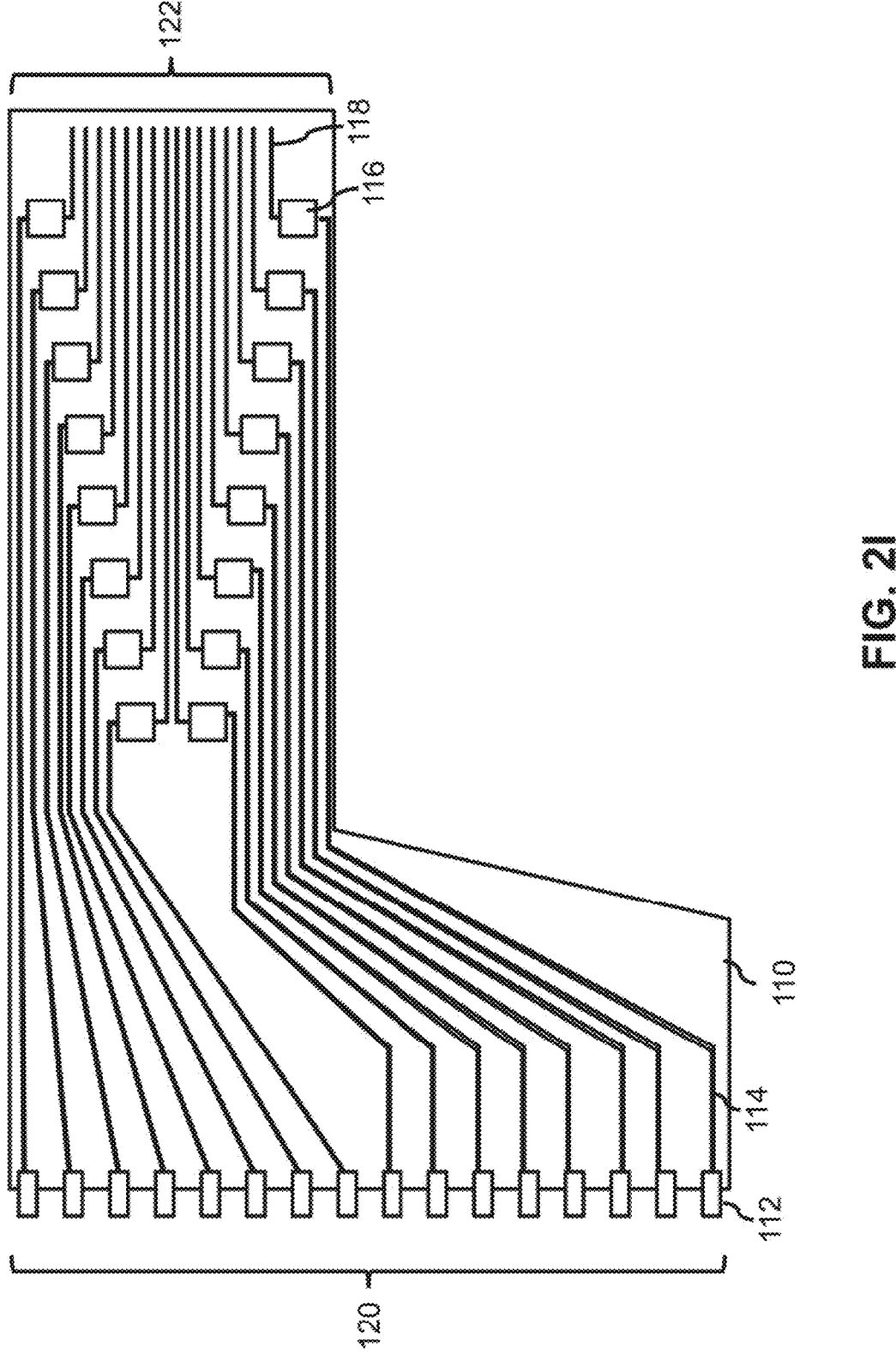
FIG. 2I depicts a right view of a second circuit card of the exemplary card-fed array with a substrate with an L-shape, in accordance with one or more embodiments of the present disclosure.
Figure 2J:
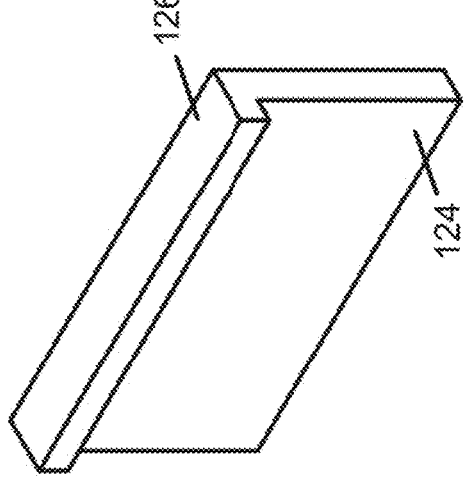
FIG. 2J depicts a perspective view of a first thermal spreader of the exemplary card-fed array, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Reference will now be made in detail to the subject matter disclosed, which is illustrated in the accompanying drawings. Embodiments of the present disclosure are generally directed to a packaging architecture for a high frequency active electronically scanned array (AESA). The packaging architecture enables the thermal management benefits of a card-fed approach to be extended to higher-frequency AESA to operate with higher output power and/or duty cycle. The packaging architecture may include circuit cards that are non-rectangular in shape to provide room for thermal management solutions that are placed between adjacent circuit cards. It is expected that the non-rectangular shape will increase the electrical loss, but will allow sufficiently improved thermal management to offset this loss and allow the system to transmit higher power.

U.S. Pat. No. 7,511,664B1, titled "Subassembly for an active electronically scanned array"; U.S. Patent Publication Number US20230178900A1, titled "Millimeter wave antenna array"; U.S. Pat. No. 8,937,574B2, titled "Light-weight air-cooled transmit/receive unit and active phased array including same"; are incorporated herein by reference in the entirety.

Referring now to FIG. 1, a card-fed array 100 is described, in accordance with one or more embodiments of the present disclosure. The card-fed array 100 may be a slat array, a phased array, an electronically scanned array (ESA), an active electronically scanned array (AESA), a high frequency AESA, or a combination thereof. The card-fed array 100 includes one or more components, such as, but not limited to, circuit cards 102, circuit cards 104, thermal spreaders 106, thermal spreaders 108, and the like.

The card-fed array 100 may include the circuit cards 102. The card-fed array 100 may also include the circuit cards 104. The circuit cards 102 and the circuit cards 104 may be referred to as a first plurality of circuit cards and a second plurality of circuit cards, respectively. The circuit cards 102 and the circuit cards 104 may be collectively referred to as circuit cards. The circuit cards may be slats, card feeds, and the like.

The circuit cards 102 and the circuit cards 104 may be arranged in parallel. The angle between the circuit cards 102 and the circuit cards 104 when the circuit cards are parallel may so closely resemble 0-degrees, for example, 1-degrees, that the circuit cards 102 and the circuit cards 104 would be considered arranged in parallel to the naked eye.

The circuit cards 102 may alternate with the circuit cards 104. For example, the card-fed array 100 may include a first of the circuit cards 102, followed by a first of the circuit cards 104, followed by a second of the circuit cards 102, followed by a second of the circuit cards 104, and so on for any integer number of the circuit cards 102 and the circuit cards 104. In embodiments, the card-fed array 100 may include a matching number of the circuit cards 102 and the circuit cards 104.

The circuit cards 102 and circuit cards 104 may each include one or more components such as but not limited to, substrates 110, radiating elements 112, transmission lines 114, transmit/receive modules 116, backplane interfaces 118, and the like.

The circuit cards 102 may include a first configuration of the substrates 110, radiating elements 112, transmission lines 114, transmit/receive modules 116, backplane interfaces 118. Similarly, the circuit cards 104 may include a second configuration of the substrates 110, radiating elements 112, transmission lines 114, transmit/receive modules 116, backplane interfaces 118. In embodiments, the circuit cards 104 are mirrored to the circuit cards 102. For example, the circuit cards 104 may be mirrored to the circuit cards 102 about a central axis of the circuit cards 102. Thus, the first configuration and the second configuration of the components are arranged in mirrored positions.

The circuit cards 102 and circuit cards 104 may each include the substrates 110. The substrates 110 may be an organic printed wiring board, a ceramic printed wiring board, or the like.

The substrates 110 may include one or more portions based on a shape of substrates 110. In embodiments, the substrates 110 may include one or more wide portions 120 and one or more narrow portions 122. The narrow portion 122 may extend from the wide portion 120. For example, the narrow portion 122 may extend from an upper or lower portion of the wide portion 120. The wide portion 120 and the narrow portion 122 may be co-planar.

The wide portion 120 may be considered "wide" and the narrow portion 122 may be considered "narrow" in that the wide portion 120 is wider than the narrow portion. In embodiments, the wide portion 120 may be at least twice as wide as the narrow portion 122. The wide portion 120 may be at least twice as wide as the narrow portion 122 to enable inserting the thermal spreaders 106 between adjacent of the circuit cards 102 and inserting the thermal spreaders 108 between adjacent of the circuit cards 104.

In embodiments, the narrow portion 122 of the substrates 110 of the circuit cards 104 are inverted to the narrow portion 122 of the substrates 110 of the circuit cards 102. For example, the narrow portion 122 of the substrates 110 of the circuit cards 102 may be considered disposed along a bottom of the card-fed array 100 while the narrow portion 122 of the substrates 110 of the circuit cards 104 may be disposed along a top of the card-fed array 100. As may be understood the recitations of the bottom and top are merely examples and may vary based on an orientation of the card-fed array 100.

In embodiments, the substrates 110 may be a non-rectangular shape. Several non-rectangular board designs are contemplated which include the wide portion 120 and the narrow portion 122. For example, the substrates 110 may include an L-shape, a U-shape, a polygonal non-rectangular shape, and the like. The L-shape may include a gnomon or a modified gnomon. For example, where the substrates 110 are an L-shape, the wide portion 120 may be considered the vertical portion and the narrow portion may be considered the horizontal portion of the L-shape. In embodiments, the wide portion 120 and the narrow portion 122 may be connected by a slanted edge.

The circuit cards 102 and circuit cards 104 may each include the radiating elements 112. The radiating elements 112 may be disposed on the substrates 110. For example, the radiating elements 112 may be disposed on the wide portion 120 of the substrates 110. For instance, radiating elements 112 may be disposed on an edge of the wide portion 120. The wide portion 120 may include a sufficient width to support a select number of the radiating elements 112 with a select spacing between the radiating elements 112.

The radiating elements 112 may be arranged in a line. For example, the radiating elements 112 may be arranged in a line on the edge of the substrates 110. For instance, the radiating elements 112 may be arranged in a line on the edge of the wide portion 120 of the substrates 110. The radiating elements 112 of each of the circuit cards 102 and the circuit cards 104 may separately form a linear array by being arranged in a line.

The radiating elements 112 from each of the circuit cards 102 and the circuit cards 104 may collectively define an array. The radiating elements 112 from each of the circuit cards 102 and the circuit cards 104 may collectively define the array. The array may be a two-dimensional array. The array defined by the radiating elements 112 may be oriented perpendicular to the circuit cards 102 and the circuit cards 104.

The power, frequency, phase, and the like of the radiating elements 112 may be electronically controlled to produce a system of one or more antennas that can transmit and/or receive one or more signals at different angles. The antennas may form one or more beams. The angular position of the beam is electronically redirected by controlling the phases of the radiating elements 112. In this regard, the radiating elements 112 may form an electronically scanned array. The signals may be transmitted and/or received while the orientation of the card-fed array 100 and/or the radiating elements 112 are fixed. In this regard, the card-fed array 100 may or may not be a mechanically scanned array.

The radiating elements 112 may be configured to operate at one or more frequencies. The radiating elements 112 may include a spacing between adjacent radiating elements based on the operating frequency. In particular, the spacing between the radiating elements 112 is a function of the wavelength at which the elements transceive radio signals. The operating frequency of the radiating elements 112 depends on the spacing between the radiating elements 112 as a function of one-half the wavelength. In embodiments, the radiating elements 112 include a one-half wavelength spacing between adjacent of the radiating elements 112. The one-half wavelength spacing may be the one-half of the smallest wavelength for which the card-fed array 100 and the circuit cards are configured. As the wavelengths decrease for higher frequencies, the spacing between the radiating elements 112 and the number of the radiating elements 112 per area similarly decreases. The radiating elements 112 may be disposed on the substrates 110 with the spacing. Similarly, the radiating elements 112 between the circuit cards 102 and the circuit cards 104 may be disposed with the spacing. In this regard, the spacing between each of the radiating elements 112 which are adjacent is identical across rows and columns of the card-fed array 100.

The radiating elements 112 may include any suitable antenna element, such as, but not limited to dipoles (e.g., half-wave dipole), horns, bowties, Vivaldi's, and the like.

The circuit cards 102 and circuit cards 104 may each include the transmission lines 114. The transmission lines 114 may connect the radiating elements 112 with the transmit/receive modules 116.

In embodiments, each of the transmission lines 114 may be a same length. Each of the transmission lines 114 may be the same length between the radiating elements 112 and the transmit/receive modules 116. Having the transmission lines 114 be the same length may ensure signals are phase-matched. It is further contemplated that the circuit cards 102 and/or the circuit cards 104 may include phase-matching circuitry to compensate for phase-mismatches between signals introduced where the transmission lines 114 are not the same length.

The circuit cards 102 and circuit cards 104 may each include the transmit/receive modules 116. The transmit/receive modules 116 may cause the radiating elements 112 to transmit and/or receive radio frequency ("RF") signals.

Each of the transmit/receive modules 116 may be connected to a respective of the radiating elements 112. Thus, the transmit/receive modules 116 may provide one-to-one control of the radiating elements 112. The transmit/receive modules 116 may control the power, frequency, phase, and the like of the radiating elements 112 to which the transmit/receive modules 116 are connected. The transmit/receive modules 116 may amplify the signals into/out of the radiating elements 112. The transmit/receive modules 116 may also switch the radiating elements 112 between transmitting and receiving the signals.

The transmit/receive modules 116 may include one or more electronic components, such as, but not limited to, high power transmit amplifiers (e.g., a final power amplifier), duplexers, filters, low-noise receive amplifiers (e.g., an initial power amplifier), phase shifters, transmit/receive switches, and the like. The electronic components of the transmit/receive modules 116 may cause the transmit/receive modules 116 to perform the various functions.

The transmit/receive modules 116 may be disposed on the narrow portion 122 of the substrates 110. The narrow portion 122 may include a sufficient width to support the corresponding number of the transmit/receive modules 116 for the radiating elements 112. The narrow portion 122 may provide a volume in which thermal spreaders can be inserted, even with small spacing between the radiating elements 112.

The transmit/receive modules 116 are spaced away from the radiating elements 112 by being disposed on the narrow portion 122 and by the radiating elements 112 being disposed on the wide portion. The transmission lines 114 may be disposed on the wide portion 120 and the narrow portion 122 between the radiating elements 112 and the transmit/receive modules 116.

A size of the transmit/receive modules 116 may be larger than a spacing between the radiating elements 112 and/or larger the one-half wavelength. In embodiments, the transmit/receive modules 116 may be staggered on the substrates 110. The transmit/receive modules 116 may be staggered on the substrates 110 to include the transmit/receive modules 116 for each of the respective of the radiating elements 112. The transmit/receive modules 116 may be staggered on the substrates 110 to allow the transmit/receive modules 116 to fit in the element spacing.

The transmit/receive modules 116 may be staggered on the substrates 110 starting from a front of the narrow portion 122 near the wide portion 120 and extending to a rear of the narrow portion 122 near the backplane. The transmit/receive modules 116 may be staggered on the substrates 110 along a diagonal line. In embodiments, the transmit/receive modules 116 may be staggered on the substrates 110 along a pair of diagonal lines. For example, a first set of the transmit/receive modules 116 may be staggered along a first diagonal line and a second set of the transmit/receive modules 116 may be staggered along a second diagonal line. The first diagonal line may be set at a positive angle and the second diagonal line may be set at a negative angle, where the angles are relative to the central axis of the circuit cards. The first set of the transmit/receive modules 116 and the second set of the transmit/receive modules 116 may include a matching number, where the number of transmit/receive modules 116 per circuit card is an even number.

The transmission lines 114 may be extended to balance the length of the transmission lines 114 to the transmit/receive modules 116 and ensure correct phase matching. For example, the correct phase matching may be ensured even where the transmit/receive modules 116 are arranged in a staggered configuration.

The circuit cards 102 and circuit cards 104 may each include the backplane interfaces 118. Each of the backplane interfaces 118 may be connected to a respective of the transmit/receive modules 116. The backplane interfaces 118 may route signals to and from the transmit/receive modules 116. Thus, signals may be routed between the radiating elements 112 and the backplane interfaces 118 through the transmission lines 114 and the transmit/receive modules 116 in both transmit and receive directions. In embodiments, the backplane interfaces 118 may route signals between the transmit/receive modules 116 and to a backplane (not depicted). The backplane may include one or more radios. The backplane interfaces 118 may be configured to connect to the backplane, for routing signals between the card-fed array 100 and one or more radios. The radio may perform one or more functions on the signals, such as up/down conversion, modulation/demodulation, and the like. The backplane may also support the card-fed array 100 at one end of the card-fed array 100.

The transmit/receive modules 116 are not 100% efficient and therefore dissipate power. Removing this dissipated power is necessary to maintain the transmit/receive modules 116 at suitable temperatures and ensure operations of the card-fed array 100.

One method to reduce the temperature of the transmit/receive modules 116 is to reduce the input power to the transmit/receive modules 116, thereby reducing the dissipated power from the transmit/receive modules 116. However, reducing the input power to the transmit/receive modules 116 may reduce the output power of the signals transmitted from the radiating elements 112 and similarly reduce the functionality of the card-fed array 100.

The card-fed array 100 may include the thermal spreaders 106. The card-fed array 100 may also include the thermal spreaders 108. The thermal spreaders 106 and the thermal spreaders 108 may be referred to as a first plurality of thermal spreaders and a second plurality of thermal spreaders, respectively. The thermal spreaders 106 and the thermal spreaders 108 may be collectively referred to as thermal spreaders. The thermal spreaders may be heat spreaders, heat sinks, thermal devices, and the like.

The thermal spreaders 106 and the thermal spreaders 108 may provide thermal management for the card-fed array 100. The thermal spreaders 106 may remove dissipated power from the circuit cards 102. Similarly, the thermal spreaders 108 may remove dissipated power from the circuit cards 104.

The thermal spreaders 106 may alternate with the thermal spreaders 108. For example, the card-fed array 100 may include a first of the thermal spreaders 106, followed by a first of the thermal spreaders 108, followed by a second of the spreaders 106, followed by a second of the thermal spreader 108, and so on for any integer number of the thermal spreaders 106 and the thermal spreaders 108. In embodiments, the card-fed array 100 may include a matching number of the thermal spreaders 106 and the thermal spreaders 108.

The thermal spreaders 106 may be coupled to the circuit cards 102. Similarly, the thermal spreaders 108 are coupled to the circuit cards 104. For example, the thermal spreaders 106 and the thermal spreaders 108 may be coupled to narrow portion 122 of the circuit cards 102 and the circuit cards 104, respectively. All but a last of the thermal spreaders 106 may be disposed between adjacent of the circuit cards 102.

Similarly, all but a last of the thermal spreaders 108 may be disposed between adjacent of the circuit cards 104.

In embodiments, the thermal spreaders 106 may not be disposed between adjacent of the circuit cards 102 and the circuit cards 104. Similarly, the thermal spreaders 108 may not be disposed between adjacent of the circuit cards 102 and the circuit cards 104. The space between the circuit cards 102 and the adjacent of the circuit cards 104 may be too small to receive the thermal spreaders due to the radiating elements 112, and similarly the circuit cards, being arranged at the half-wavelength spacing.

The thermal spreaders 106 and the thermal spreaders 108 may be made of a select material. For example, the material may include, but is not limited to, aluminum, copper, a composite (e.g., aluminum, graphite), or the like. The material may generally include any material that has sufficiently high effective thermal conductivity to transport the dissipated power from the plates 124 to the flanges 126.

The thermal spreaders 106 and the thermal spreaders 108 may include one or more plates 124, flanges 126, coolant interfaces 128, spreader-to-spreader interfaces 130, and the like.

Each of the thermal spreaders 106 and the thermal spreaders 108 may include the plates 124. The plates 124 may be substantially flat or planar surfaces. The plates 124 may be aligned in parallel with the substrates 110. The plates 124 of the thermal spreaders 106 may be disposed between adjacent of the circuit cards 102. Similarly, the plates 124 of the thermal spreaders 108 may be disposed between adjacent of the circuit cards 104. The plates 124 of the thermal spreaders 106 may be coupled the substrates 110 of the circuit cards 102. Similarly, the plates 124 of the thermal spreaders 108 may be coupled to the substrates 110 of the circuit cards 104. In embodiments, the plates 124 may be coupled to the narrow portion 122. In embodiments, the plates 124 are not coupled to the wide portion 120. The substrates 110 of the circuit cards 102 may be disposed between the transmit/receive modules 116 and the thermal spreaders 106. Similarly, the substrates 110 of the circuit cards 104 may be disposed between the transmit/receive modules 116 and the thermal spreaders 106. For example, the transmit/receive modules 116 and the thermal spreaders may be coupled to opposing sides of the substrates 110. For instance, the radiating elements 112, the transmission lines, the transmit/receive modules 116 and/or the backplane interfaces 118 may be coupled to a front side of the substrates 110 and the thermal spreaders may be coupled to a backside of the substrates 110.

Heat from the transmit/receive modules 116 may then conduct through the substrates 110 of the circuit cards 102 and the circuit cards 104 directly to the thermal spreaders 106 and thermal spreaders 108, respectively.

Each of the thermal spreaders 106 and the thermal spreaders 108 may include the flanges 126. The flanges 126 may extend from the plates 124. For example, the flanges 126 may extend from an edge of the plates 124. The plates 124 and the flanges 126 may form an L-shape, or the like.

The thermal spreaders 106 and the thermal spreaders 108 may transport power which is dissipated by the transmit/receive modules 116 from the plates 124 to the flanges 126.

The heat may be removed from the flanges 126 via one or more external devices. For example, a fluid-cooled heat sink, cold plate, or similar system-level thermal management device may be coupled to the flanges 126. For instance, cold plates may be attached to the flanges 126. The flanges 126 may increase the surface area between the thermal spreaders and the cold plate. The increased surface area may improve the heat transfer rate of the thermal spreaders.

The flanges 126 may abut with adjacent of the flanges 126. For example, the flanges 126 of the thermal spreaders 106 may abut with adjacent flanges of the thermal spreaders 106. By way of another example, the flanges 126 of the thermal spreaders 108 may abut with adjacent flanges of the thermal spreaders 108. The flanges 126 may abut with adjacent of the flanges 126 to form a flat surface. For instance, the flanges 126 of the thermal spreaders 106 may abut to form a flat surface over the narrow portion 122 of the substrates 110 of the circuit cards 102. By way of another instance, the flanges 126 of the thermal spreaders 108 may abut to form a flat surface over the narrow portion 122 of the substrates 110 of the circuit cards 104.

The flanges 126 may include a width. The width of the flanges 126 may be based on the operational frequency of the radiating elements 112. For example, the width of the flanges 126 may be equal to one-half the wavelength causing the flanges 126 to abut.

In embodiments, a coolant may flow through the thermal spreaders 106 and/or the thermal spreaders 108. The coolant may flow through the plates 124, the flanges 126, and/or the spreader-to-spreader interfaces 130. For example, the plates 124, the flanges 126, and/or the spreader-to-spreader interfaces 130 may include one or more interior channels through which the coolant may flow. The coolant may remove the dissipated power from the transmit/receive modules 116. The coolant may remove the dissipated power through convection and/or phase changes. The coolant may include any suitable coolant, such as a liquid coolant, a gas coolant, a two-phase coolant, or the like.

The thermal spreaders 106 and/or the thermal spreaders 108 may include the coolant interfaces 128. For example, the coolant interfaces 128 may be coupled to the plates 124, the flanges 126, and/or the spreader-to-spreader interfaces 130. The coolant interfaces 128 may also be coupled to an exterior coolant pump. For example, the coolant interfaces 128 may be coupled to an exterior coolant pump via a blind mate connector with the backplane. Coolant may be pumped into and out of the thermal spreaders 106 and/or the thermal spreaders 108 via the coolant interfaces 128.

Although the thermal spreaders 106 and/or the thermal spreaders 108 have been described as including coolant interfaces 128, this is not intended as a limitation of the present disclosure. In embodiments, the thermal spreaders 106 and/or the thermal spreaders 108 may include a heat pipe, two-phase passive cooling devices (e.g., wicked heat pipes, vapor chambers, oscillating heat pipes), and the like. In this regard, the coolant may flow through but may not be pumped into and/or out of the thermal spreaders 106 and/or the thermal spreaders 108.

The thermal spreaders 106 and/or the thermal spreaders 108 may include the spreader-to-spreader interfaces 130. The spreader-to-spreader interfaces 130 connect the thermal spreaders 106 and the thermal spreaders 108. For example, the spreader-to-spreader interfaces 130 may connect the plates 124 of the thermal spreaders 106 to the plates of the thermal spreaders 108. The plates 124 of the thermal spreaders 106 may be offset from the plates of the thermal spreaders 108. In this regard, the spreader-to-spreader interfaces 130 may be a jog, bend, step, or the like between the plates 124. In embodiments, the thermal spreaders 106 may be formed as a monolithic unit with the thermal spreaders 108 by the spreader-to-spreader interfaces 130. The spreader-to-spreader interfaces 130 may transfer heat between the thermal spreaders 106 and the thermal spreaders 108. Transferring heat between thermal spreaders 106 and the thermal spreaders 108 may ensure uniform heat distribution. For example, some of the transmit/receive modules 116 may generate more heat, depending upon the power, frequency, phase, and the like of which the transmit/receive modules 116 are controlling the radiating elements 112. The spreader-to-spreader interfaces 130 may distribute the heat to a cooler of the thermal spreaders 106 and the thermal spreaders 108 for subsequent removal by the flanges 126.

The spreader-to-spreader interfaces 130 may be disposed between the narrow portions 122 of the substrates 110 of each of the circuit cards 102 and the circuit cards 104. For example, the width of the narrow portions 122 may be less than half of the width of the wide portion 120, such that a gap is formed between the narrow portions of the substrates 110 of each of the circuit cards 102 and the circuit cards 104. The spreader-to-spreader interfaces 130 may be disposed in the gap.

In embodiments, the card-fed array 100 may define an airgap between the thermal spreaders and the transmit/receive modules 116 of the adjacent of the circuit cards. For example, the thermal spreaders 106 which are coupled to the substrates 110 of the circuit cards 102 may be separated from the transmit/receive modules 116 of the adjacent of the circuit cards 102 by an airgap. By way of another example, the thermal spreaders 108 which are coupled to the substrates 110 of the circuit cards 104 may be separated from the transmit/receive modules 116 of the adjacent of the circuit cards 104 by an airgap. The airgap between the thermal spreaders 106 and the transmit/receive modules 116 of the adjacent of the circuit cards may be beneficial for ease-of-assembly.

Although the card-fed array 100 is described as defining an airgap between the thermal spreaders and the transmit/receive modules 116 of the adjacent of the circuit cards, this is not intended as a limitation of the present disclosure. In embodiments, the thermal spreaders 106 may abut the transmit/receive modules 116 of the adjacent of the circuit cards. For example, the thermal spreaders 106 which are coupled to the substrates 110 of the circuit cards 102 may abut the transmit/receive modules 116 of the adjacent of the circuit cards 102. By way of another example, the thermal spreaders 108 which are coupled to the substrates 110 of the circuit cards 104 may abut the transmit/receive modules 116 of the adjacent of the circuit cards 104. The abutment between the thermal spreaders and the transmit/receive modules 116 of the adjacent of the circuit cards 104 may provide two paths for heat transfer for each of the circuit cards, at the expense of reducing ease-of-assembly.

In embodiments, the card-fed array 100 is scalable. The card-fed array 100 may be scalable by increasing the number of radiating elements 112 per row and/or per column. The terminology of rows and columns is not intended to be limiting and may be used interchangeably, depending upon the orientation of the card-fed array 100.

The radiating elements 112 of the circuit cards 102 and circuit cards 104 may each separately form a row of the radiating elements 112. In this regard, the number of radiating elements 112 per card may control the number of radiating elements 112 per row. The number of radiating elements 112 per row may or may not be scalable by stacking multiple of the circuit cards 102 and circuit cards 104. For example, the flanges 126 of the thermal spreaders 106 from the first stack may interfere with the flanges 126 of the thermal spreaders 108 from the second stack. Instead, the number of radiating elements 112 per row is scalable by scaling the number of radiating elements 112 per card.

The radiating elements 112 of the circuit cards 102 and circuit cards 104 may each collectively form columns of the radiating elements 112. In this regard, the number of the circuit cards 102 and circuit cards 104 may control the number of radiating elements per column. The number of radiating elements 112 per column may be scalable by increasing the number of the circuit cards 102 and circuit cards 104 along the length of the card-fed array 100. The circuit cards 102 and circuit cards 104 may be extended indefinitely along the length of the card-fed array 100, provided the backplane to which the backplane interfaces 118 are coupled supports the selected length and number of cards. Additional of the thermal spreaders 106 and thermal spreaders 108 are added with the circuit cards 102 and circuit cards 104.

Referring now to FIGS. 2A-2J, an example of the card-fed array 100 is described, in accordance with one or more embodiments of the present disclosure. In this example, the card-fed array 100 is a sixteen-card array, such that the card-fed array 100 includes eight of the circuit cards 102 and eight of the circuit cards 104. The card-fed array 100 includes eight of the thermal spreaders 106 coupled to the circuit cards 102. The card-fed array 100 also includes eight of the thermal spreaders 108 coupled to the circuit cards 104. The circuit cards 102 and the circuit cards 104 each include sixteen of the radiating elements 112 and transmit/receive modules 116, such that the card-fed array 100 includes a sixteen-by-sixteen array of the radiating elements 112. The substrates 110 of the circuit cards 102 and the circuit cards 104 is configured in the L-shape. In this example, the thermal spreaders 106 and the thermal spreaders 108 do not include the spreader-to-spreader interfaces 130 to join the thermal spreaders 106 to the thermal spreaders 108. Rather, the thermal spreaders 106 are separated from the thermal spreaders 108 by an airgap.

Figure 3:
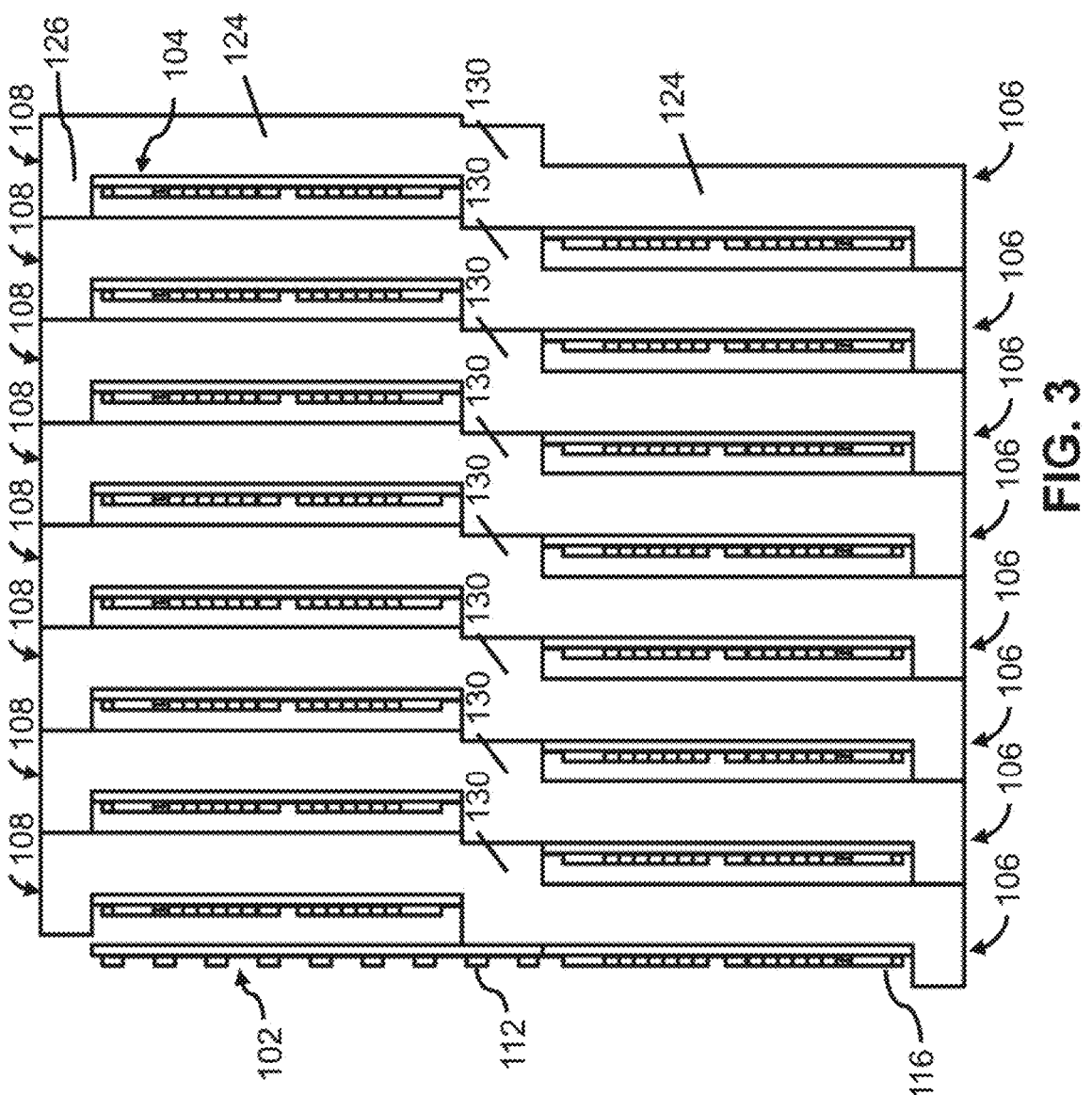
FIG. 3 depicts a rear view of an exemplary card-fed array with thermal spreaders which are coupled by spreader-to-spreader interfaces, in accordance with one or more embodiments of the present disclosure.

Referring now to FIG. 3, an example of the card-fed array 100 is described, in accordance with one or more embodiments of the present disclosure. In this example, the card-fed array 100 is modified from the previous example to include the thermal spreaders 106 and the thermal spreaders 108 which are connected by the spreader-to-spreader interfaces 130. The thermal spreaders 106, the thermal spreaders 108, and the spreader-to-spreader interfaces 130 may be formed as a monolithic thermal spreader. The thermal spreaders 106 and the thermal spreaders 108 are each coupled to the circuit cards 102 and the circuit cards 104, such that two of the circuit cards are attached to the same monolithic thermal spreader. The geometry of the monolithic thermal spreader may establish the half-wavelength spacing between the radiating elements 112. When multiple of the circuit cards are attached to the same monolithic spreader, the dimensions of the monolithic spreader must be precise enough to meet the half wavelength requirement. Thus, the spreader-to-spreader interfaces 130 may enable transferring heat between the thermal spreaders 106 and the thermal spreaders 108 at the expense of increased manufacturing tolerances.

Although the card-fed array 100 is described as including the spreader-to-spreader interfaces 130, this is not intended as a limitation of the present disclosure. The thermal spreaders 106 and the thermal spreaders 108 may be separate components. The thermal spreaders 106 and the thermal spreaders 108 are each coupled to the circuit cards 102 and the circuit cards 104, such one of the circuit cards is coupled to one of the thermal spreaders. With one spreader per circuit board, the physical spacing between the circuit cards is defined by the backplane interfaces 118 and/or as mechanical attachments that hold the thermal spreaders together.

Figure 4:
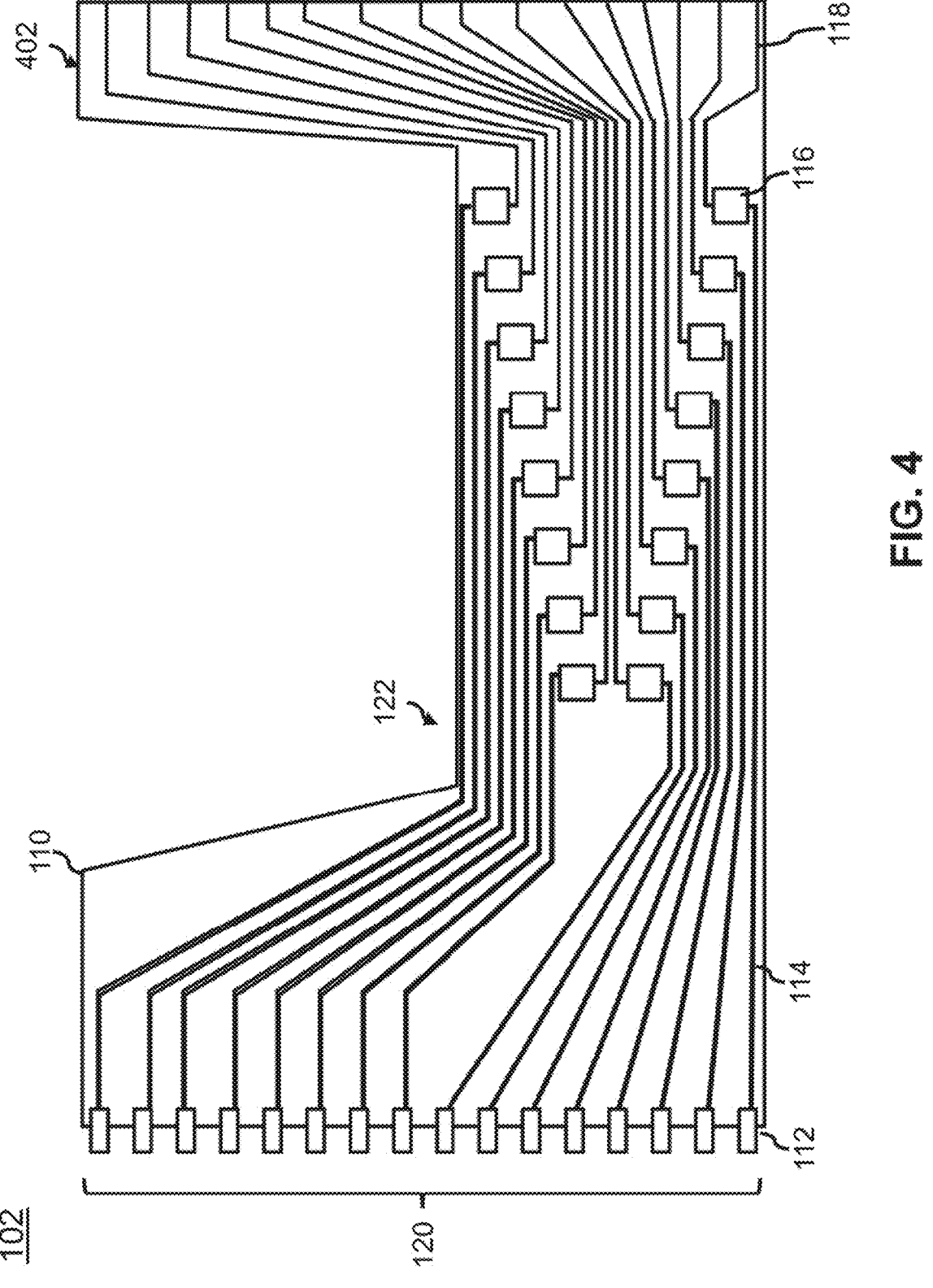
FIG. 4 depicts a right view of a first circuit card with a substrate with a U-shape, in accordance with one or more embodiments of the present disclosure.

Referring now to FIG. 4, an example of the circuit card 102 is described, in accordance with one or more embodiments of the present disclosure. In this example, the circuit card 102 which has substrate 110 with a U-shape. The substrate 110 may include an additional wide portion 402. The additional wide portion 402 may extend from the narrow portion 122. The narrow portion 122 may be disposed between the wide portion 120 and the additional wide portion 402. The backplane interfaces 118 may extend from the transmit/receive modules 116 along the narrow portion 122 and the additional wide portion 402. For example, the backplane interfaces 118 may extend up to an end of the additional wide portion 402, where the end opposes the end on which the radiating elements 112 are disposed. It is contemplated that the U-shape may be beneficial to spread out the backplane interfaces 118 on the substrate 110 for connecting to the backplane, as compared to the L-shape.

Figure 5A:
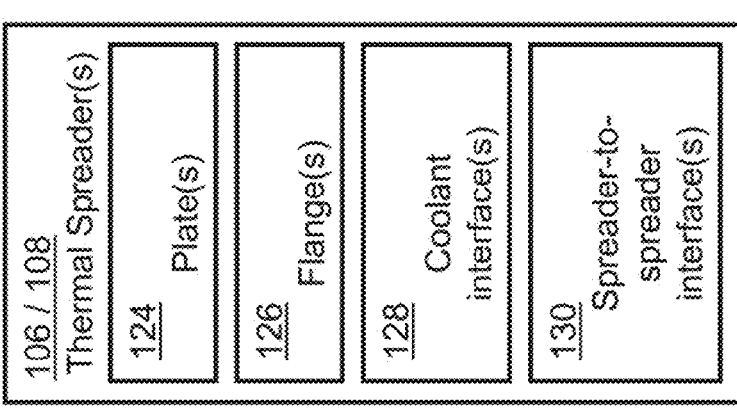
FIG. 5A depicts a simplified block diagram of a card-fed array, in accordance with one or more embodiments of the present disclosure.
Figure 5A:
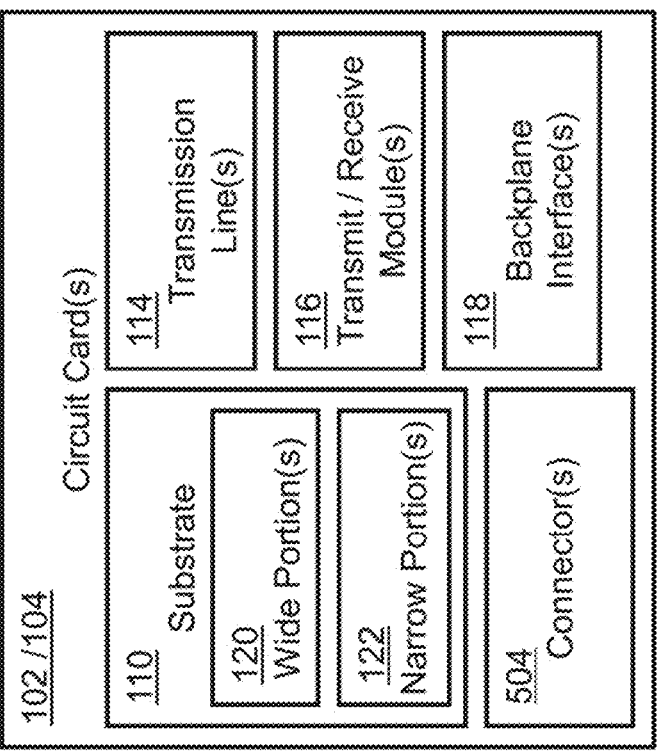
Figure 5A:
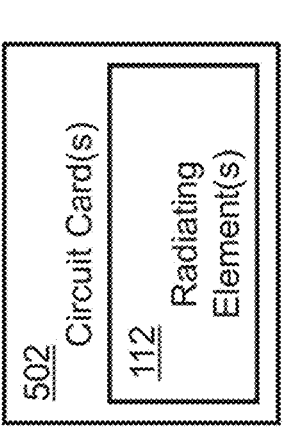
Figure 5B:
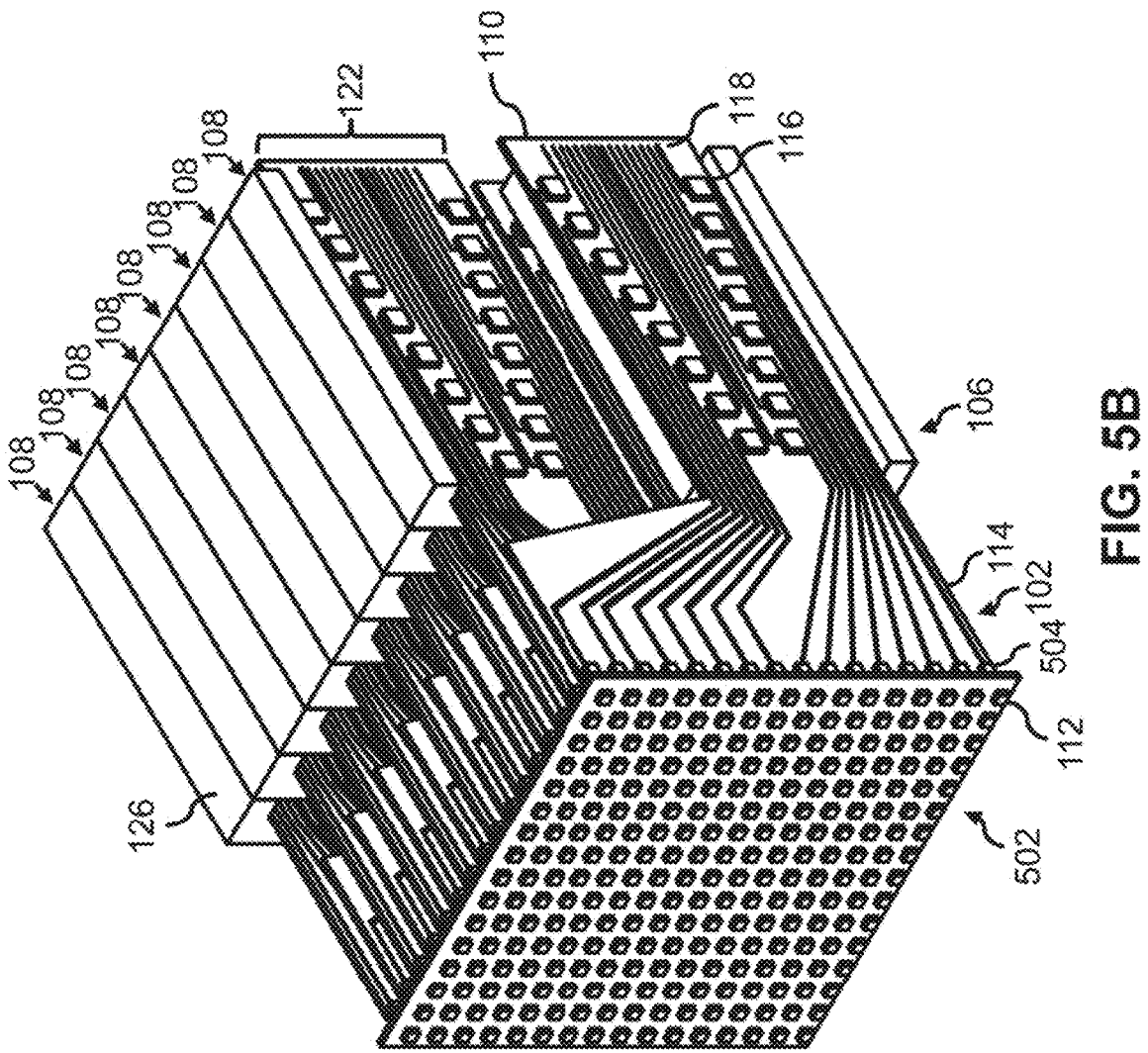
FIGS. 5B-5C depict a front right perspective view of exemplary card-fed arrays, in accordance with one or more embodiments of the present disclosure.
Figure 5C:
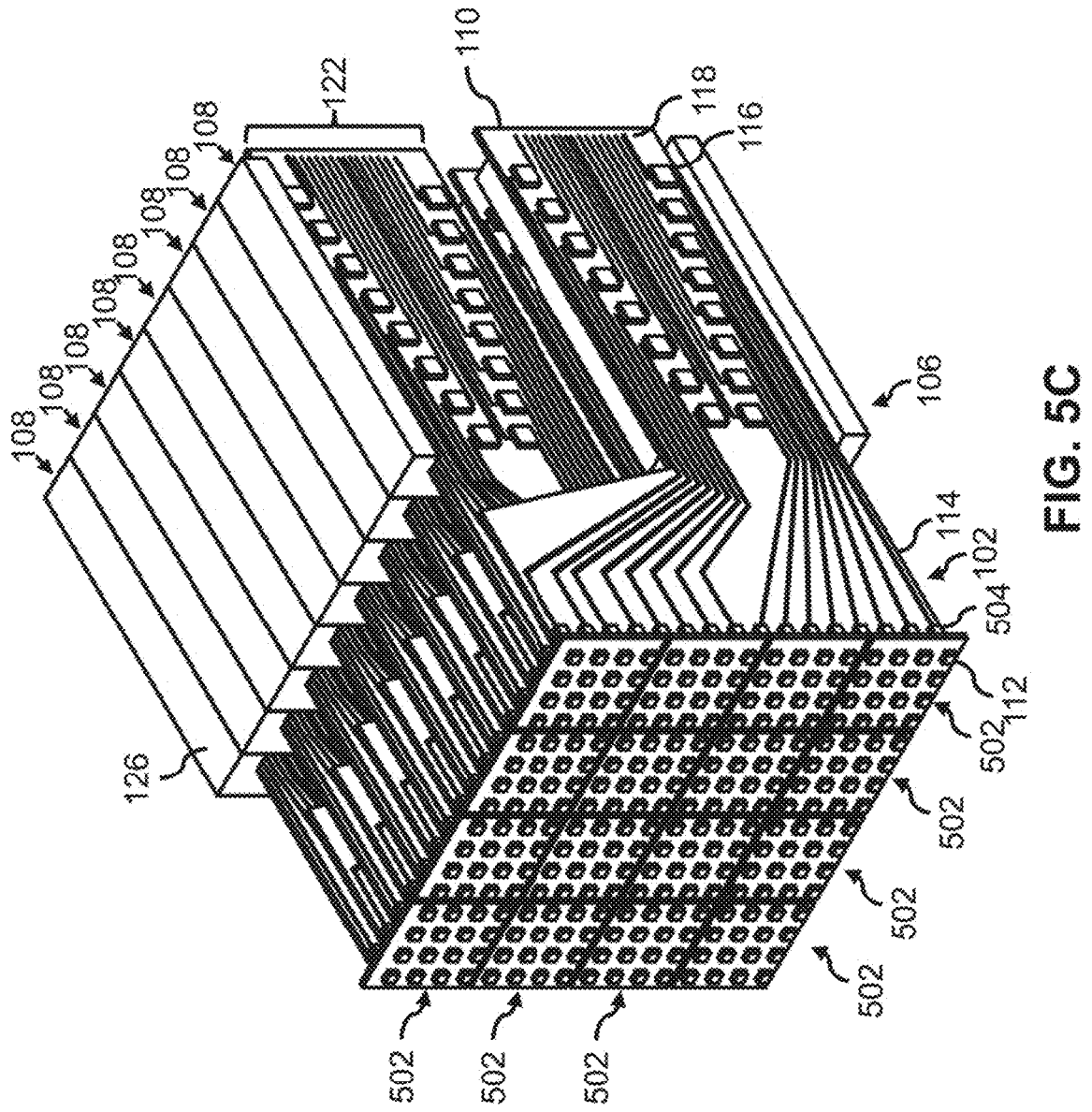

Referring now to FIGS. 5A-5C, the card-fed array 100 is described, in accordance with one or more embodiments of the present disclosure. Although the circuit cards 102 and the circuit cards 104 are described as including the radiating elements 112, this is not intended as a limitation of the present disclosure. The circuit cards 102 and the circuit cards 104 may include connectors 504. The connectors 504 may be disposed on the substrates 110. For example, the connectors 504 may be disposed on the wide portion 120 of the substrates 110. For instance, connectors 504 may be disposed on an edge of the wide portion 120. The connectors 504 may be arranged in a line. For example, the connectors 504 may be arranged in a line on the edge of the substrates 110. For instance, the connectors 504 may be arranged in a line on the edge of the wide portion 120 of the substrates 110.

In embodiments, the card-fed array 100 may include one or more circuit cards 502. The circuit cards 502 may be referred to as third circuit cards. The circuit cards 502 may be orthogonal to the circuit cards 102 and the circuit cards 104. The circuit cards 502 may include the radiating elements 112. The radiating elements 112 may collectively define an array. The array may be a two-dimensional array. The radiating elements 112 of the circuit cards 502 may connect to the connectors 504 of the circuit cards 102 and the circuit cards 104. The number of the radiating elements 112 may correspond to the number of the connectors 504. Thus, the radiating elements 112 may be connected to the transmit/receive modules 116 of the circuit cards 102 and the circuit cards 104 by way of the connectors 504 and the transmission lines 114.

In embodiments, the card-fed array 100 may include a single of the circuit cards 502 with the radiating elements 112 which are coupled to each of the connectors 504 of the circuit cards 102 and the circuit cards 104. The single of the circuit cards 502 may be scaled by changing the number of the radiating elements 112 per row and column of the circuit card 502.

In embodiments, the card-fed array 100 may include a plurality of the circuit cards 502 which are tiled. The radiating elements 112 of the plurality of the circuit cards 502 may be connected to a subset of the connectors 504 of the circuit cards 102 and the circuit cards 104. It is contemplated that the number of the radiating elements 112 in the card-fed array 100 may be scaled by tiling the circuit cards 502. For example, the number of the circuit cards 502 may be adjusted to scale the number of the radiating elements 112 in the card-fed array 100.

Referring generally again to the figures.

It is contemplated that the card-fed array 100 may be used in a variety of applications, such as, but not limited to, sensors, communication, radar, electronic warfare, and the like.

The card-fed array 100 may be used with a wide range of operational frequencies. It is contemplated that the card-fed array 100 may be particularly suited for use with frequencies in the Ka-band (e.g., 26.5 to 40 GHz), V-band (40 to 75 GHz) and/or the W-band (e.g., 75 to 115 GHz). It is contemplated that the card-fed array 100 may enable the use of the thermal spreaders in the V-band and/or W-band. In embodiments, the operational frequency of the card-fed array 100 may be between 40 to 100 GHz. For example, the operational frequency of the card-fed array 100 may be between 50 and 70 GHz. Other frequencies higher and lower than these ranges may also be used. For example, frequencies below the V-band may be used. By way of another example, the card-fed array 100 may be designed to support frequencies up to 100 GHz. The half-wavelength at 100 GHz may be approximately 1.5 mm (e.g., 1.499 mm). The half-wavelength at 100 GHz may approach the thickness of the circuit cards (e.g., a thickness of the substrates 110 plus a thickness of the transmit/receive modules 116). Thus, an upper limit of the frequency may be bound, at least in part, by the thickness of the circuit cards. It is contemplated that the operational frequencies may be at or above 100 GHz, provided that the thickness of the circuit cards are reduced.

One downside with the design of the card-fed array 100 is that the length of the transmission lines 114 are increased in length as compared to card-fed arrays with transmit/receive modules which are immediately adjacent to radiating elements. The increase in length of the transmission lines 114 increases an RF loss of the amplified signal in transmit. Efficiency may be defined as a function of output power and input power, where the difference between the output power and the input power is the dissipated power to be removed from the thermal spreaders. Thus, the card-fed array 100 provides a trade-off by providing the ability to use the thermal spreaders for operational frequencies in the V-band and/or W-band at the cost of the decreased efficiency. It is contemplated that the card-fed array 100 may provide a net power increase in transmit even when considering the decreased efficiency. The higher thermal capacity of the cooling architecture may allow for much higher power dissipation and lead to a substantial net increase in the output RF power from each radiating element 112, even with the increased loss in the transmission lines 114. For example, the improved thermal management from the thermal spreaders may enable driving the radiating elements 112 with more input power to compensate for the loss in efficiency, while adequately dissipating waste heat from the transmit/receive modules 116. The higher output power may improve the capabilities and allow operation over longer distances, greater sensitivity, higher functionality with multiple beams, and the like.

It is further contemplated that each of the embodiments of the methods described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mixable and/or physically interacting components and/or wirelessly inter-actable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A card-fed array comprising:
   a first plurality of circuit cards;
   a second plurality of circuit cards; wherein the first plurality of circuit cards alternate with the second plurality of circuit cards; wherein each of the first plurality of circuit cards and the second plurality of circuit cards comprise:
   a substrate; wherein the substrate comprises one or more wide portions and one or more narrow portions; wherein the one or more wide portions are wider than the one or more narrow portions; wherein the one or more narrow portions extend from the one or more wide portions;
   a plurality of radiating elements; wherein the plurality of radiating elements are disposed on the one or more wide portions of the substrate;
   wherein the plurality of radiating elements are arranged in a line;
   a plurality of transmission lines;
   a plurality of transmit/receive modules; wherein the plurality of transmit/receive modules are disposed on the one or more narrow portions of the substrate; wherein the plurality of transmission lines connect the plurality of radiating elements with the plurality of transmit/receive modules; and a plurality of backplane interfaces; wherein the plurality of backplane interfaces are coupled to the plurality of transmit/receive modules;

a first plurality of thermal spreaders; wherein the first plurality of thermal spreaders are coupled to the one or more narrow portions of the substrates of the first plurality of circuit cards; and a second plurality of thermal spreaders; wherein the second plurality of thermal spreaders are coupled to the one or more narrow portions of the substrates of the second plurality of circuit cards;

wherein the card-fed array is an active electronically scanned array; wherein the second plurality of circuit cards are mirrored to the first plurality of circuit cards; wherein the one or more narrow portions of the substrates of the second plurality of circuit cards are inverted to the one or more narrow portions of the substrates of the first plurality of circuit cards.

2. The card-fed array of claim 1, wherein the first plurality of circuit cards and the second plurality of circuit cards are arranged in parallel.

3. The card-fed array of claim 1, wherein each of the first plurality of thermal spreaders and the second plurality of thermal spreaders comprise a plate and a flange; wherein the flange extends from the plate;

wherein the plates of the first plurality of thermal spreaders are coupled to the one or more narrow portions of the substrates of the first plurality of circuit cards; wherein the plates of the second plurality of thermal spreaders are coupled to the one or more narrow portions of the substrates of the second plurality of circuit cards.

4. The card-fed array of claim 3, wherein the flanges of the first plurality of thermal spreaders abut with adjacent flanges of the first plurality of thermal spreaders; wherein the flanges of the second plurality of thermal spreaders abut with adjacent flanges of the second plurality of thermal spreaders.

5. The card-fed array of claim 3, wherein the first plurality of thermal spreaders and the second plurality of thermal spreader each comprise a spreader-to-spreader interface; wherein the spreader-to-spreader interfaces connect the plates of the first plurality of thermal spreaders and the plates of the second plurality of thermal spreaders.

6. The card-fed array of claim 5, wherein the plates of the first plurality of thermal spreaders are offset from the plates of the second plurality of thermal spreaders.

7. A card-fed array comprising:

a first plurality of circuit cards;

a second plurality of circuit cards; wherein the first plurality of circuit cards alternate with the second plurality of circuit cards; wherein each of the first plurality of circuit cards and the second plurality of circuit cards comprise:

a substrate; wherein the substrate comprises one or more wide portions and one or more narrow portions; wherein the one or more wide portions are wider than the one or more narrow portions; wherein the one or more narrow portions extend from the one or more wide portions;

a plurality of connectors; wherein the plurality of connectors are disposed on the wide portion of the substrate; wherein the plurality of connectors are arranged in a line;

a plurality of transmission lines;

a plurality of transmit/receive modules; wherein the plurality of transmit/receive modules are disposed on the one or more narrow portions of the substrate; wherein the plurality of transmission lines connect the plurality of connectors with the plurality of transmit/receive modules; and a plurality of backplane interfaces; wherein the plurality of backplane interfaces are coupled to the plurality of transmit/receive modules;

a first plurality of thermal spreaders; wherein the first plurality of thermal spreaders are coupled to the one or more narrow portions of the substrates of the first plurality of circuit cards;

a second plurality of thermal spreaders; wherein the second plurality of thermal spreaders are coupled to the one or more narrow portions of the substrates of the second plurality of circuit cards; and one or more third circuit cards; wherein the one or more third circuit cards are orthogonal to the first plurality of circuit cards and the second plurality of circuit cards; wherein the one or more third circuit cards comprise a plurality of radiating elements; wherein the plurality of radiating elements are connected to the plurality of connectors; wherein the card-fed array is an active electronically scanned array; wherein the second plurality of circuit cards are mirrored to the first plurality of circuit cards; wherein the one or more narrow portions of the substrates of the second plurality of circuit cards are inverted to the one or more narrow portions of the substrates of the first plurality of circuit cards.

8. The card-fed array of claim 1, wherein an operational frequency of the first plurality of circuit cards and the second plurality of circuit cards is in at least one of a Ka-band, a V-band, or a W-band.

9. The card-fed array of claim 8, wherein the operational frequency is between 40 to 100 GHz.

10. The card-fed array of claim 1, wherein the plurality of transmit/receive modules are staggered on the substrate.

11. The card-fed array of claim 10, wherein the plurality of transmit/receive modules are staggered on the substrate along a pair of diagonal lines.

12. The card-fed array of claim 1, wherein each of the plurality of transmit/receive modules are connected to a respective radiating element of the plurality of radiating elements.

13. The card-fed array of claim 1, wherein the one or more wide portions are at least twice as wide as the one or more narrow portions.

14. The card-fed array of claim 1, wherein the substrate is one of an L-shape or a U-shape.

15. The card-fed array of claim 1, wherein the plurality of radiating elements are disposed on an edge of the one or more wide portions of the substrate.

16. The card-fed array of claim 1, wherein the one or more wide portions and the one or more narrow portions are co-planar.

\* \* \* \* \*